(12) United States Patent
Shim et al.

(10) Patent No.: US 8,854,879 B2
(45) Date of Patent: Oct. 7, 2014

(54) METHOD OF PROGRAMMING A NONVOLATILE MEMORY DEVICE AND NONVOLATILE MEMORY DEVICE PERFORMING THE METHOD

(71) Applicant: Samsung Electronics Co., Ltd., Suwon-Si (KR)

(72) Inventors: Dong-Kyo Shim, Seoul (KR); Min-Seok Kim, Hwaseong-si (KR); Tae-Young Kim, Seoul (KR); Ki-Tae Park, Seongnam-si (KR); Jae-Yong Jeong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 57 days.

(21) Appl. No.: 13/755,448

(22) Filed: Jan. 31, 2013

(65) Prior Publication Data
US 2013/0301352 A1   Nov. 14, 2013

(30) Foreign Application Priority Data

May 9, 2012 (KR) ........................ 10-2012-0048910

(51) Int. Cl.
| | |
|---|---|
| G11C 16/04 | (2006.01) |
| G11C 11/56 | (2006.01) |
| G11C 16/10 | (2006.01) |
| G11C 16/34 | (2006.01) |

(52) U.S. Cl.
CPC ............ *G11C 16/10* (2013.01); *G11C 11/5628* (2013.01); *G11C 16/0483* (2013.01); *G11C 16/3418* (2013.01)

USPC ............ 365/185.03; 365/185.33; 365/185.22; 365/185.29

(58) Field of Classification Search
CPC ........ G11C 16/10; G11C 16/06; G11C 16/14; G11C 16/34
USPC .............. 365/185.03, 185.33, 185.22, 185.29
See application file for complete search history.

(56) References Cited

U.S. PATENT DOCUMENTS

| | | | |
|---|---|---|---|
| 2003/0048667 A1* | 3/2003 | Mori et al. ................ | 365/185.33 |
| 2008/0310225 A1 | 12/2008 | Roohparvar | |
| 2010/0128523 A1 | 5/2010 | Yip | |
| 2010/0321998 A1 | 12/2010 | Jang | |
| 2011/0007571 A1 | 1/2011 | Park et al. | |
| 2011/0103151 A1 | 5/2011 | Kim et al. | |

FOREIGN PATENT DOCUMENTS

| | | |
|---|---|---|
| KR | 1020100137128 A | 12/2010 |
| KR | 1020110006137 A | 1/2011 |
| KR | 1020110048638 A | 5/2011 |

* cited by examiner

*Primary Examiner* — Thong Q Le
(74) *Attorney, Agent, or Firm* — Volentine & Whitt, PLLC

(57) ABSTRACT

A method of programming a nonvolatile memory device including multi-level cells that store multi-bit data, includes performing a pre-programming operation that programs at least some of the multi-level cells to a plurality of intermediate states which are different from an erased state, and performing a main programming operation that programs the multi-level cells to a plurality of target states corresponding to the multi-bit data. At least some of the intermediate program states have threshold voltage distributions that partially overlap each other.

20 Claims, 15 Drawing Sheets

METHOD OF PROGRAMMING A NONVOLATILE MEMORY DEVICE AND NONVOLATILE MEMORY DEVICE PERFORMING THE METHOD

CROSS-REFERENCE TO RELATED APPLICATION

This application claims priority under 35 USC §119 to Korean Patent Application No. 10-2012-0048910, filed on May 9, 2012 in the Korean Intellectual Property Office (KIPO), the contents of which are herein incorporated by reference in their entirety.

BACKGROUND

1. Technical Field

Example embodiments relate to semiconductor memory devices, and more particularly to nonvolatile memory devices and methods of programming nonvolatile memory devices.

2. Description of the Related Art

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Memory cells of a nonvolatile memory device, such as a flash memory device, may be classified into single level cells (SLCs) that store one bit of data per memory cell and multi-level cells (MLCs) that store more than one bit of data per memory cell.

To ensure accurate storage of the multi-bit data, the threshold voltage distributions of the MLCs must be separated by adequate sensing margins. However, certain aspects of newer flash memory devices, such as increasing integration density, may cause the threshold voltage distributions to widen due to electrical coupling between adjacent memory cells or a programming disturbance.

SUMMARY

Accordingly, the inventive concept is provided to substantially obviate one or more problems due to limitations and disadvantages of the related art.

Some example embodiments provide a method of programming a nonvolatile memory device capable of reducing an increase of the threshold voltage distribution due to coupling of memory cells and programming time.

According to some example embodiments, a method of programming a nonvolatile memory device including multi-level cells that store multi-bit data, includes performing a pre-programming operation that programs at least some of the multi-level cells to a plurality of intermediate states distinct from an erased state and performing a main programming operation that programs the multi-level cells to a plurality of target states corresponding to the multi-bit data. At least some of the intermediate program states have threshold voltage distributions that partially overlap each other.

In some embodiments, the pre-programming operation may be performed by applying bitline forcing voltages with different levels to bitlines connected to the multi-level cells while applying a pre-programming pulse to the multi-level cells.

The intermediate states may include at least first through third intermediate states, a threshold voltage distribution of the first intermediate state is substantially same as a threshold voltage distribution of the erased state, a threshold voltage distribution of the second intermediate state is greater than the threshold voltage distribution of the erased state, and a threshold voltage distribution of the third intermediate state is greater than the threshold voltage distribution of the second intermediate state.

An inhibit voltage having a power supply voltage level may be applied to a multi-level cell having the erased state, a first bitline forcing voltage may be applied to a multi-level cell having the first intermediate state, a second bitline forcing voltage may be applied to a multi-level cell having the second intermediate state and a third bitline forcing voltage may be applied to a multi-level cell having the third intermediate state. The first bit line forcing voltage may the power supply voltage level and the second and third bitline forcing voltages may be between the power supply voltage level and a ground voltage level.

The second bitline forcing voltage may be greater than the third bitline forcing voltage.

In some embodiments, the pre-programming pulse may be applied to the multi-level cells one time.

In some embodiments, the intermediate states may include at least first through seventh intermediate states, and the pre-programming pulse may be applied to the multi-level cells a plurality of times.

Performing the pre-programming operation may include dividing the erased state and the first through seventh intermediate states into a plurality of groups and applying the bitline forcing voltages to bitlines connected to multi-level cells included in each of the groups while applying the pre-programming pulse to the multi-level cells in each group.

A threshold voltage distribution of the first intermediate state may be substantially same as a threshold voltage distribution of the erased state. Each threshold voltage distribution of the second through seventh intermediate states may be gradually greater than the preceding one, and the pre-programming pulse applied to the group including the multi-level cells having a greater threshold voltage distribution may have a greater level than the pre-programming pulse applied to the group including the multi-level cells having a smaller threshold voltage distribution.

Bitline forcing voltages applied to bitlines connected to the multi-level cells except for the multi-level cells having the erased state may have levels which are inversely proportional to each threshold voltage distribution of the second through seventh intermediate states and are between the power supply voltage level and a ground voltage level.

While the pre-programming pulse is applied to one of the groups, an inhibit voltage having a power supply voltage level may be applied to bitlines connected to multi-level cells of other groups.

In some embodiments, the main programming operation may be performed by applying an incremental step pulse to the multi-level cells.

In some embodiments, performing the pre-programming operation may include selecting at least two of the intermediate states and applying bitline forcing voltages to bitlines connected to multi-level cells having the selected intermediate states while applying the pre-programming pulse to the multi-level cells having the selected intermediate states.

The bitline forcing voltages may have levels according to the selected intermediate states, and the pre-programming pulse may be applied to the multi-level cells having the selected intermediate states at least one time.

According to some example embodiments, a method of programming a nonvolatile memory device including multi-level cells that store multi-bit data, performing a first preprogramming operation that programs at least some of the multi-level cells to a plurality of intermediate states which are different from an erased state, applying a plurality of pre-programming verify voltages to the multi-level cells to verify the intermediate states, performing selectively a second pre-programming operation on the multi-level cells based on the verified intermediate states, and performing a main programming operation that programs the multi-level cells to a plurality of target states corresponding to the multi-bit data. At least some of the intermediate program states have threshold voltage distributions that partially overlap each other.

Accordingly, the main program is performed after the pre-program that programs the multi-level cells to intermediate program states distinct from an erased state by bitline forcing voltages to the bitlines connected to the multi-level cells while applying pre-program pulse to the multi-level cells, thereby reducing the increase in width of threshold voltage distributions due to coupling or a disturb and reducing program overhead due to applying pre-program pulse once.

According to some example embodiments, a nonvolatile memory device comprises: a memory cell array comprising a plurality if word lines, a plurality of bitlines, and a plurality of nonvolatile multi-level cells (MLCs) each connected to respective ones of the wordlines and the bitlines, wherein each MLC is configured to store at least two bits of data therein; a row decoder configured to supply row addresses to be applied to wordlines of the memory cell array during operations of writing the data into the MLCs and reading the data stored in the MLCs; a voltage generator configured to generate one or more bitline voltages for being supplied to one or more of the bitlines and one or more wordline voltages for being applied to one or more of the wordlines; a control circuit configured to control an operation of the row decoder; and an input/output (I/O) circuit configured to write the data into the MLCs and read the data from the MLCs under control of the controller. The I/O circuit is configured to write the data into the MLCs by: performing a pre-programming operation that programs at least some of the MLCs to a plurality of intermediate states which are different from an erased state of the MLCs, at least some of the intermediate states having threshold voltage distributions that partially overlap each other, and performing a main programming operation that programs the multi-level cells to a plurality of target states corresponding to the multi-bit data.

In some embodiments, the I/O circuit is configured, to apply bitline forcing voltages with different levels to bitlines connected to the MLCs while applying a pre-programming pulse to the MLCs when writing the data into the MLCs.

In some embodiments, the intermediate states include at least first through third intermediate states, a threshold voltage distribution of the first intermediate state is substantially same as a threshold voltage distribution of the erased state, a threshold voltage distribution of the second intermediate state is greater than the threshold voltage distribution of the erased state, and a threshold voltage distribution of the third intermediate state is greater than the threshold voltage distribution of the second intermediate state.

In some embodiments, the I/O circuit is configured to apply an inhibit voltage having a power supply voltage level to an MLC having the erased state, to apply a first bitline forcing voltage to a MLC having the first intermediate state, to apply a second bitline forcing voltage to a MLC having the second intermediate state and to apply a third bitline forcing voltage to a MLC having the third intermediate state, the first bit line forcing voltage having the power supply voltage level and the second and third bitline forcing voltages being between the power supply voltage level and a ground voltage level.

In some embodiments, the second bitline forcing voltage is greater than the third bitline forcing voltage.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
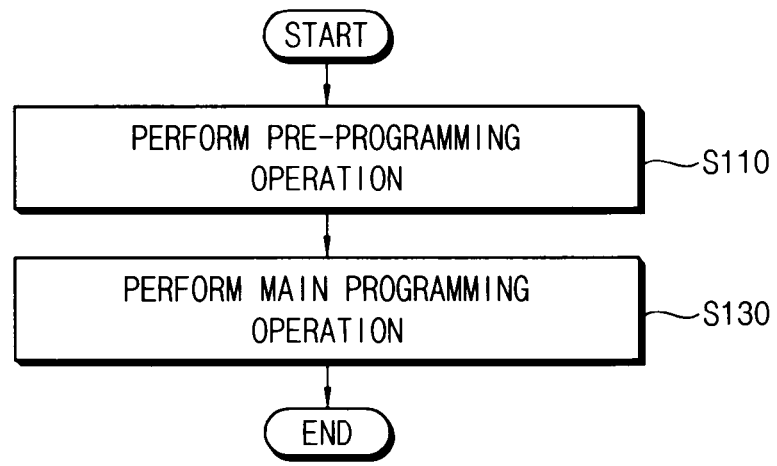
FIG. 1 is a flowchart illustrating a method of programming a nonvolatile memory device according to some example embodiments.

Various example embodiments will be described more fully with reference to the accompanying drawings, in which embodiments are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flowchart illustrating a method of programming a nonvolatile memory device according to some example embodiments.

Referring to FIG. 1, in a nonvolatile memory device including multi-level cells that each store multi-bit data, a pre-programming operation is performed which programs at least some of the multi-level cells to a plurality of intermediate states which are different from an erased state (S110). At least some of the intermediate states have threshold voltage distributions that partially overlap each other. Here, multi-bit data indicates data which has more than one bit, and the multi-level cells indicate nonvolatile memory cells that can store more than one bit of data per memory cell.

For example, the pre-programming operation may be performed by applying bitline forcing voltages with different levels to bitlines connected to the multi-level cells while applying a pre-programming operation pulse to the multi-level cells.

For example, when the target program state to be programmed is an erased state, an inhibit voltage having a power supply voltage level is applied to a bitline connected to the multi-level cell to be programmed to the erased state. For example, when the target program state to be programmed is the highest state whose threshold voltage distribution is farthest from the erased state, a bitline forcing voltage having a ground voltage level (0 V) is applied to a bitline connected to the multi-level cell, and the multi-level cell is pre-programmed to one of the intermediate states.

For example, when the target program state to be programmed is a state between the erased state and the highest state, a bitline forcing voltage having a voltage level between the power supply voltage and the ground voltage is applied to a bitline connected to the multi-level cell, and the multi-level cell is pre-programmed to one of the intermediate states.

After the pre-programming operation is performed, a main programming operation is performed which programs the multi-level cells to a plurality of target states corresponding to the multi-bit data (S130). In some embodiments, the main programming operation may be performed using an incremental step pulse programming (ISPP) method. For example, to perform the main programming operation, an incremental step pulse, which increases by a predetermined voltage level per programming loop, may be applied to the multi-level cells, and verify voltages corresponding to the multi-bit data may be applied to verify whether the multi-bit data are properly programmed in the multi-level cells.

As described above, in a method of programming a nonvolatile memory device according to some example embodiments, the main programming operation is performed after the pre-programming operation that programs the multi-level cells to intermediate program states which are different from an erased state by applying bitline forcing voltages to the bitlines connected to the multi-level cells while applying a pre-programming pulse to the multi-level cells, thereby reducing the increase in the width of threshold voltage distributions due to coupling or a disturbance and reducing programming overhead due to applying the pre-programming pulse once.

Figure 2A:
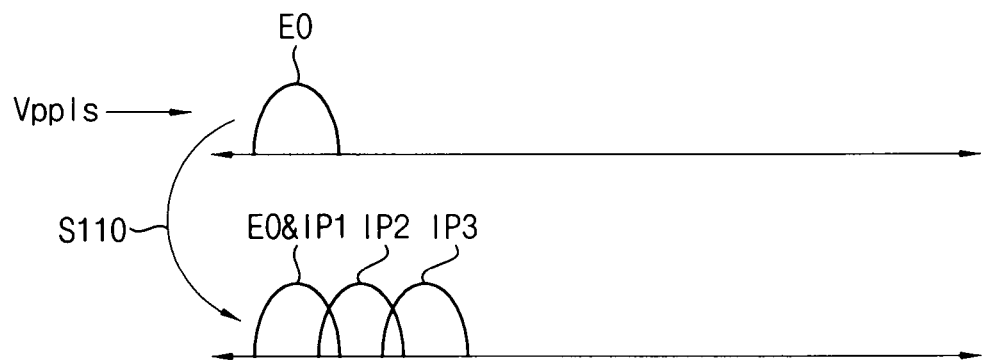
FIG. 2A is a diagram illustrating an example of threshold voltage distributions of multi-levels cells when the pre-programming operation is performed by a programming method according to example embodiments.

FIG. 2A is a diagram illustrating an example of threshold voltage distributions of multi-levels cells when the pre-programming operation is performed by a programming method according to example embodiments.

Figure 2B:
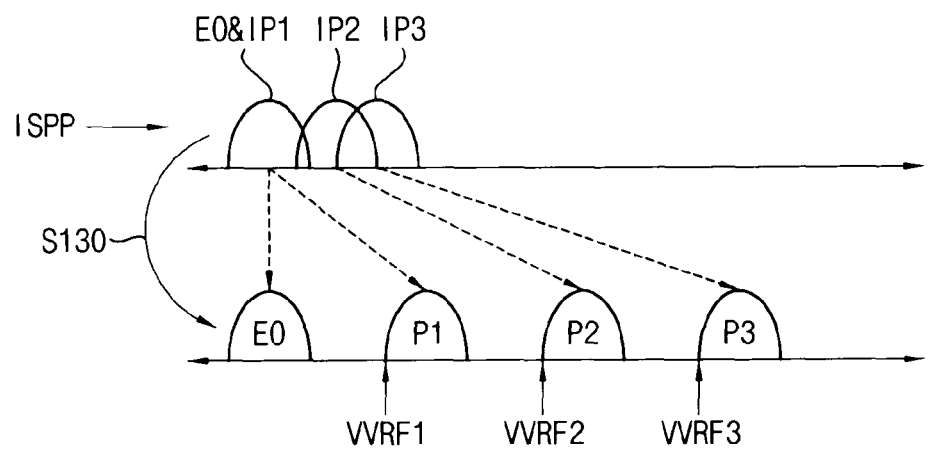
FIG. 2B is a diagram illustrating an example of threshold voltage distributions of multi-levels cells when the main programming operation is performed by a programming method according to example embodiments.

FIG. 2B is a diagram illustrating an example of threshold voltage distributions of multi-levels cells when the main programming operation is performed by a programming method according to example embodiments.

In FIGS. 2A and 2B, two-bit data are programmed each multi-level cell.

Referring to FIGS. 1 and 2A, a pre-programming operation is performed (S110) by applying the pre-programming pulse Vppls to the multi-level cells having the erased state E0 such that at least some of the multi-level cells are programmed to a plurality of intermediate states which are different from an erased state, and at least some of the intermediate states have threshold voltage distributions that partially overlap with each other. When the pre-programming operation is performed, the multi-level cells have an erased state E0 and first through third intermediate states IP1~IP3 according to target program states to be programmed. In the example illustrated in FIGS. 1 and 2A-B, the threshold voltage distribution of the first intermediate state IP1 is same as the threshold voltage distribution of the erased state E0. The threshold voltage distribution of the second intermediate state IP2 is greater than the threshold voltage distribution of the first intermediate state IP1, and the threshold voltage distribution of the third intermediate state IP3 is greater than the threshold voltage distribution of the second intermediate state IP2. In addition, the threshold voltage distribution of the second intermediate state IP2 partially overlaps the threshold voltage distribution of the erased state E0, and the threshold voltage distribution of the third intermediate state IP3 partially overlaps the threshold voltage distribution of the second intermediate state IP2.

While the pre-programming pulse Vppls is applied to the multi-level cells, an inhibit voltage having a power supply voltage Vcc level is applied to the bitlines connected to the multi-level cells having the erased state E0. In addition, while the pre-programming pulse Vppls is applied to the multi-level cells, a bitline forcing voltage having a power supply voltage Vcc level is applied to the bitlines connected to the multi-level cells having the first intermediate state IP1. In addition, while the pre-programming pulse Vppls is applied to the multi-level cells, a bitline forcing voltage having a second level which is less than the power supply voltage Vcc level is applied to the bitlines connected to the multi-level cells having the second intermediate state IP2. In addition, while the pre-programming pulse Vppls is applied to the multi-level cells, a bitline forcing voltage having a third level which is less than the second level is applied to the bitlines connected to the multi-level cells having the third intermediate state IP3.

For example, when a multi-level cell is to be programmed to the '00' state, the multi-level cell may have an erased state E0. In addition, when a multi-level cell is to be programmed to the '01' state, the multi-level cell may have a first intermediate state IP1 which is same as an erased state E0. In addition, when a multi-level cell is to be programmed to the '11' state, the multi-level cell may have a second intermediate state IP2. In addition, when a multi-level cell is to be programmed to the '10' state, the multi-level cell may have a third intermediate state IP3.

Referring to FIG. 2B, when the main programming operation is performed (S 130) by applying ISPP to the multi-level cells, the multi-level cells have one of an erased state E0, a first program state P1, a second program state P2 and a third program state P3 according to the multi-bit data. For example, by the main programming operation, the multi-level cells having the first intermediate state IP1 may be programmed to the first program state P1 corresponding to a first verify voltage VVRF1, the multi-level cells having the second intermediate state IP2 may be programmed to the second program state P2 corresponding to a second verify voltage VVRF2, and the multi-level cells having the third intermediate state IP3 may be programmed to the third program state P3 corresponding to a third verify voltage VVRF3.

For example, the erased state E0, the first program state P1, the second program state P2 and the third program state P3 may correspond to values of the multi-bit data values "11", "01", "00" and "10", respectively. According to example embodiments, various logic values of the multi-bit data may be allocated to the respective target states E0, P1, P2 and P3.

In FIGS. 2A and 2B, the multi-level cells to be programmed to the multi-bit data values "00" and "10" are selected and pre-programmed to the second and third intermediate states IP2 and IP3 which are different from the erased state E0.

Figure 3:
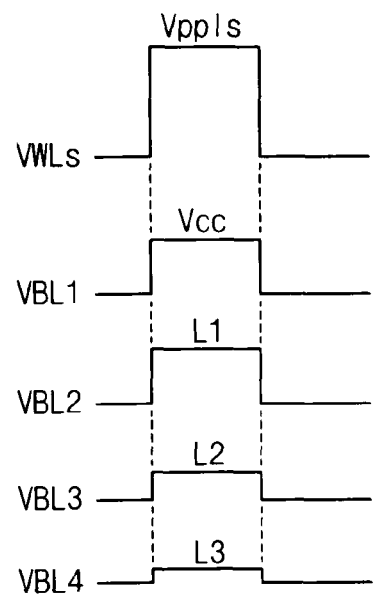
FIG. 3 illustrates voltages applied when the pre-programming operation of FIG. 2A is performed.

FIG. 3 illustrates voltages applied when the pre-programming operation of FIG. 2A is performed.

Referring to FIGS. 1, 2A and 3, while the pre-programming operation is performed, the pre-programming pulse Vppls is applied to the multi-level cells connected to a selected wordline WLs as a wordline voltage VWLs, and bitline forcing voltages having a power supply voltage Vcc level or first through third levels L1~L3 according to respective intermediate states are applied to the bitlines as bitline voltages VBL1~VBL4. The inhibit voltage VBL1 having a power supply voltage Vcc level is applied to the bitlines connected to the multi-level cells having the erased state E0, a bitline forcing voltage VBL2 having the first level L1 the same as the power supply voltage Vcc is applied to the bitlines connected to the multi-level cells having the first intermediate state IP1, a bitline forcing voltage VBL3 having the second level L2 which is less than first level L1 is applied to the bitlines connected to the multi-level cells having the second intermediate state IP2 and a bitline forcing voltage VBL4 having a third level L3 which is less than the second level L2 is applied to the bitlines connected to the multi-level cells having the third intermediate state IP3. When the bitline forcing voltages having different levels are applied to the bitlines connected to the multi-level cells while the pre-programming pulse Vppls is applied to the multi-level cells connected to the selected wordline, an increase of the threshold voltage of the multi-level cells may be different according to the levels of the bitline forcing voltages because the effect of channel boosting of the multi-level cells may be different according to the levels of the bitline forcing voltages.

As described above, in a method of programming a non-volatile memory device according to some example embodiments, threshold voltage distributions of some of the multi-level cells are moved in advance by performing the pre-programming operation, and a threshold voltage distribution of the multi-level cells having the erased state E0 is moved by performing the main programming operation. Therefore, an increase of the threshold voltage distribution of the multi-level cells having the erased state E0 due to a coupling effect of the multi-level cells having other states may be reduced.

Figure 4:
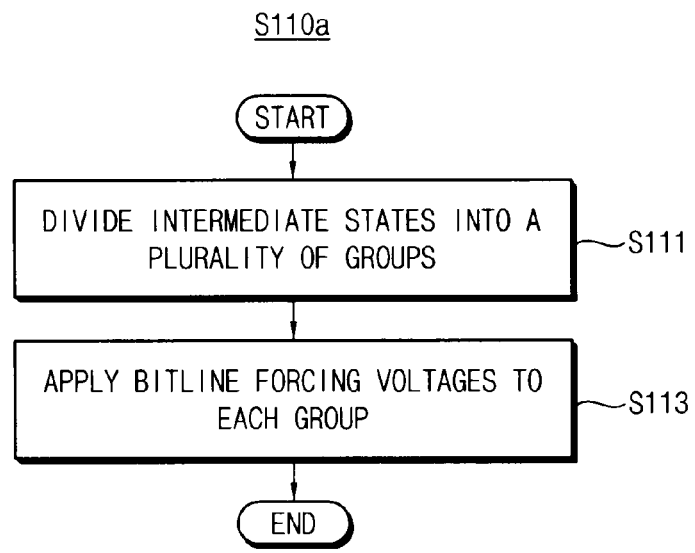
FIG. 4 is a flowchart illustrating the step of performing the pre-programming operation in FIG. 1 according to some example embodiments.

FIG. 4 is a flowchart illustrating the step of performing the pre-programming operation in FIG. 1 according to some example embodiments.

Referring to FIG. 4, for performing the pre-programming operation, the intermediate states are divided into a plurality of groups (S111). While the pre-programming pulse is applied to each group, the bitline forcing voltages are applied to the bitlines connected to the multi-level cells according to respective intermediate states of the multi-level cells (S113). FIG. 4 will be described in detail with reference to FIGS. 5A through 8.

Figure 5A:
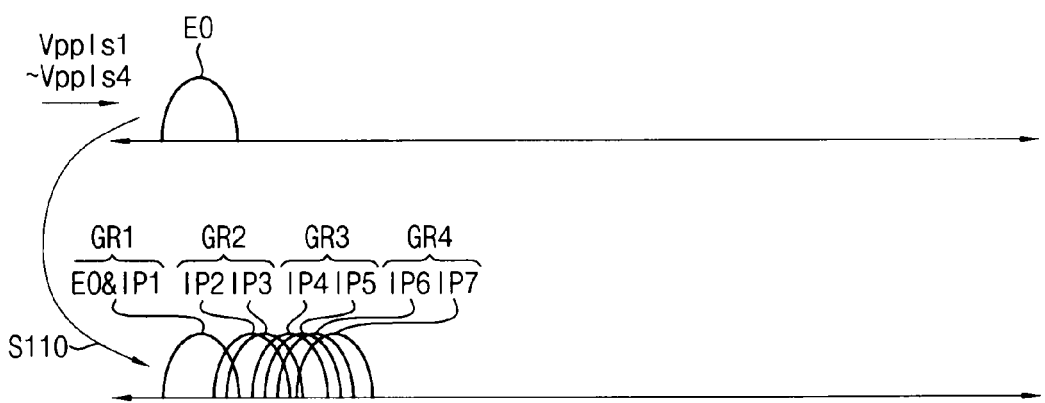
FIG. 5A is a diagram illustrating an example of threshold voltage distributions of multi-levels cells when the pre-programming operation is performed by a programming method according to example embodiments.

FIG. 5A is a diagram illustrating an example of threshold voltage distributions of multi-levels cells when the pre-programming operation is performed by a programming method according to example embodiments.

Figure 5B:
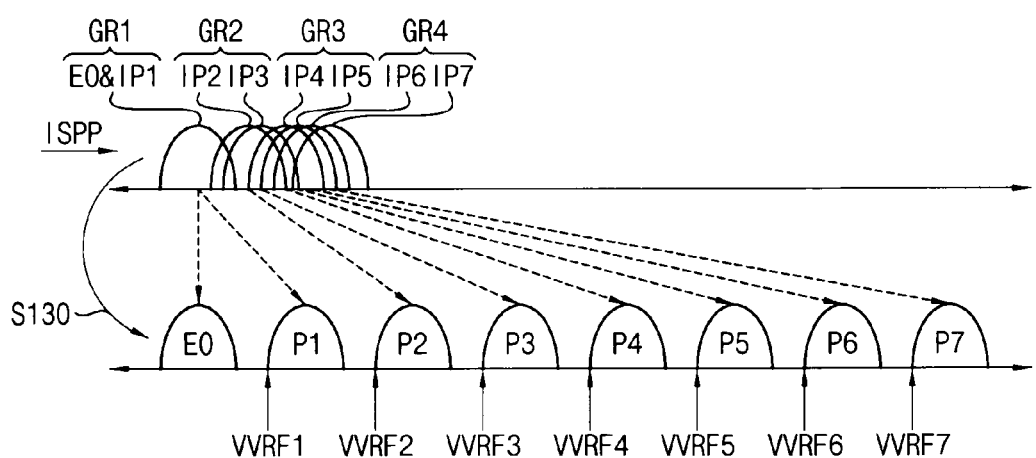
FIG. 5B is a diagram illustrating an example of threshold voltage distributions of multi-levels cells when the main programming operation is performed by a programming method according to example embodiments.

FIG. 5B is a diagram illustrating an example of threshold voltage distributions of multi-levels cells when the main programming operation is performed by a programming method according to example embodiments.

In FIGS. 5A and 5B, three-bit data are programmed into each multi-level cell.

Referring to FIGS. 1, 4 and 5A, a pre-programming operation is performed (S 110) by applying the pre-programming pulses Vppls1~Vppls4 to the multi-level cells having the erased state E0 such that at least some of the multi-level cells are programmed to a plurality of intermediate states which are different from an erased state and at least some of the intermediate states have threshold voltage distributions that partially overlap with each other. When the pre-programming operation is performed, the multi-level cells have an erased state E0 and first through seventh intermediate states IP1~IP7 according to target program state to be programmed. In the example illustrated in FIGS. 5A-B, the threshold voltage distribution of the first intermediate state IP1 is the same as the threshold voltage distribution of the erased state E0. The threshold voltage distribution of the second intermediate state IP2 is greater than the threshold voltage distribution of the first intermediate state IP1, the threshold voltage distribution of the third intermediate state IP3 is greater than the threshold voltage distribution of the second intermediate state IP2, the threshold voltage distribution of the fourth intermediate state IP4 is greater than the threshold voltage distribution of the third intermediate state IP3, the threshold voltage distribution of the fifth intermediate state IP5 is greater than the threshold voltage distribution of the fourth intermediate state IP4, the threshold voltage distribution of the sixth intermediate state IP6 is greater than the threshold voltage distribution of the fifth intermediate state IP5, and the threshold voltage distribution of the seventh intermediate state IP7 is greater than the threshold voltage distribution of the sixth intermediate state IP6. That is, the second through seventh intermediate states IP2~IP7 have threshold voltage distributions which are different from the erased state E0.

The plurality of intermediate states E0 and IP1~IP7 may be divided into a plurality of groups GR1~GR4 according to target program states to be programmed (S111). The first group GR1 may include the erased state E0 and the first intermediate state IP1, the second group GR2 may include the second intermediate state IP2 and the third intermediate state IP3, the third group GR3 may include the fourth intermediate state IP4 and the fifth intermediate state IP5, and the fourth group GR4 may include the sixth intermediate state IP6 and the seventh intermediate state IP7. While the pre-programming pulses Vppls1~Vppls4 are applied to the groups GR1~GR4, corresponding bitline forcing voltages are applied to the bitlines connected to the multi-level cells according to the corresponding intermediate states of the multi-level cells included in the respective groups GR1~GR4. Since the intermediate states E0 and IP1~IP7 are divided into four groups GR1~GR4, the pre-programming pulses Vppls1~Vppls4 are applied to the multi-level cells four times.

Referring to FIG. 5B, when the main programming operation is performed (S 130) by applying ISPP to the multi-level cells, the multi-level cells have one of an erased state E0, a first program state P1, a second program state P2, a third program state P3, a fourth program state P4, a fifth program state P5, a sixth program state P6 and a seventh program state P7 according to the multi-bit data. For example, by the main programming operation, the multi-level cells having the first intermediate state IP1 may be programmed to the first program state P1 corresponding to a first verify voltage VVRF1, the multi-level cells having the second intermediate state IP2 may be programmed to the second program state P2 corresponding to a second verify voltage VVRF2, the multi-level cells having the third intermediate state IP3 may be programmed to the third program state P3 corresponding to a third verify voltage VVRF3, the multi-level cells having the fourth intermediate state IP4 may be programmed to the fourth program state P4 corresponding to a fourth verify voltage VVRF4, the multi-level cells having the fifth intermediate state IP5 may be programmed to the fifth program state P5 corresponding to a fifth verify voltage VVRF5, the multi-level cells having the sixth intermediate state IP6 may be programmed to the sixth program state P6 corresponding to a sixth verify voltage VVRF3, and the multi-level cells having the seventh intermediate state IP7 may be programmed to the seventh program state P7 corresponding to a seventh verify voltage VVRF7.

For example, the erased state E0, the first program state P1, the second program state P2, the third program state P3, the fourth program state P4, the target program state P5, the target program state P6 and the seventh program state P7 may correspond to the multi-bit data values "111", "011", "001", "101", "100", "000", "010" and "110", respectively, but are not limited thereto. According to example embodiments, various logic vales of the multi-bit data may be allocated to the respective program states E0, P1, P2, P3, P4, P5, P6 and P7.

Figure 6:
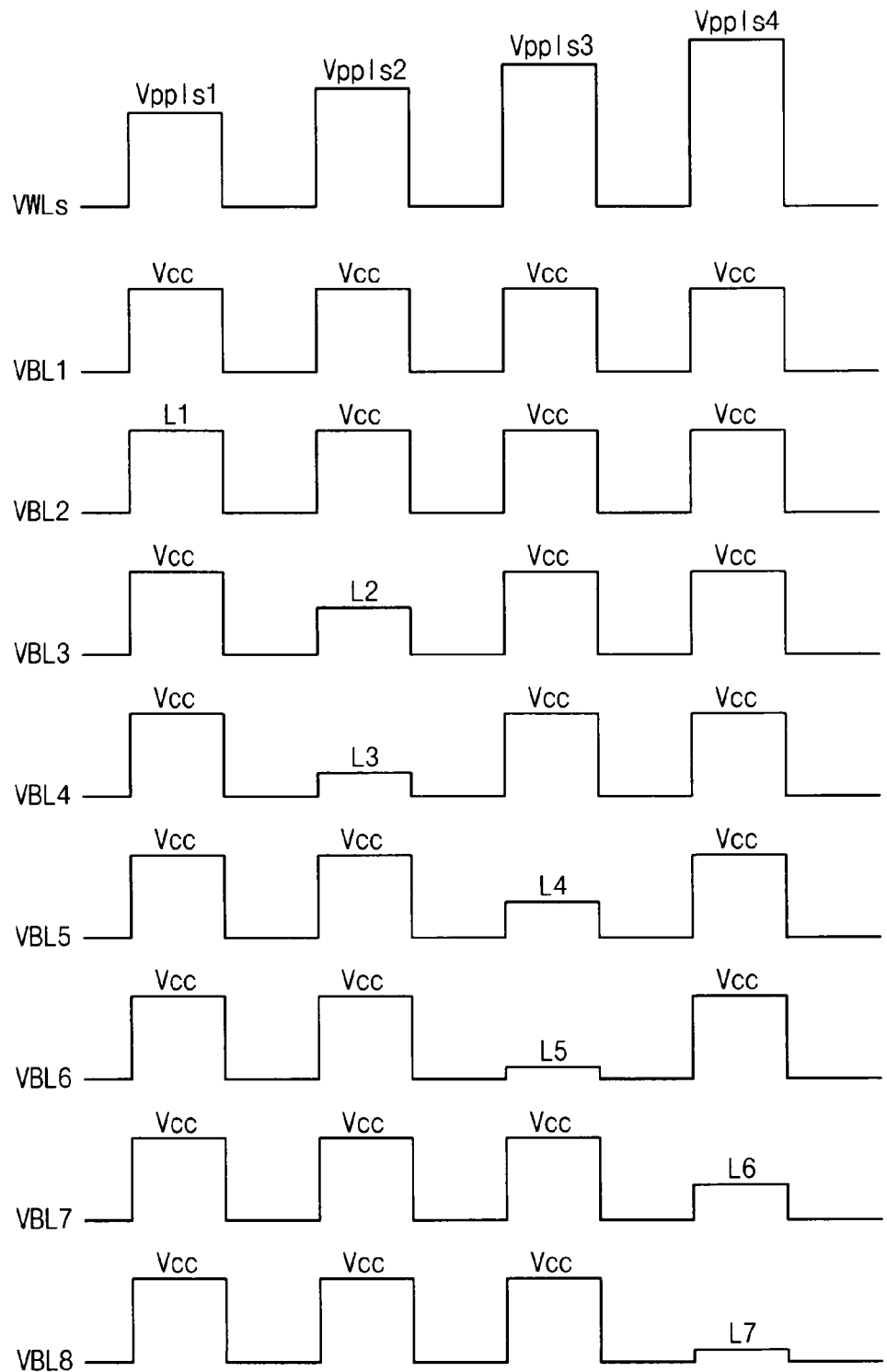
FIG. 6 illustrates voltages applied when the pre-programming operation of FIG. 5A is performed.

FIG. 6 illustrates voltages applied when the pre-programming operation of FIG. 5A is performed.

Referring to FIGS. 1, 4, 5A and 6, while the pre-programming operation is performed, the pre-programming pulses Vppls1~Vppls4 are applied to the multi-level cells connected to a selected wordline WLs as a wordline voltage VWLs, and bitline forcing voltages having a power supply voltage Vcc level or first through seventh levels L1~L7, according to respective intermediate states, are applied to the bitlines as bitline voltages VBL1~VBL8. The inhibit voltage VBL1 having a power supply voltage Vcc level is applied to the bitlines connected to the multi-level cells having the erased state E0, a bitline forcing voltage VBL2 having the first level L1 which is the same as the power supply voltage Vcc is applied to the bitlines connected to the multi-level cells having the first intermediate state IP1, a bitline forcing voltage VBL3 having the second level L2 which is less than first level L1 is applied to the bitlines connected to the multi-level cells having the second intermediate state IP2, a bitline forcing voltage VBL4 having a third level L3 which is less than the second level L2 is applied to the bitlines connected to the multi-level cells having the third intermediate state IP3, a bitline forcing voltage VBL5 having a fourth level L4 which is less than the third level L3 is applied to the bitlines connected to the multi-level cells having the fourth intermediate state IP4, a bitline forcing voltage VBL6 having a fifth level L5 which is less than the fourth level L4 is applied to the bitlines connected to the multi-level cells having the fifth intermediate state IP5, a bitline forcing voltage VBL7 having a sixth level L6 which is less than the fifth level L5 is applied to the bitlines connected to the multi-level cells having the sixth intermediate state IP6 and a bitline forcing voltage VBL8 having a seventh level L7 which is less than the sixth level L6 is applied to the bitlines connected to the multi-level cells having the seventh intermediate state IP7. The second through seventh levels L2~L7 are between the power supply voltage Vcc level and the ground voltage level. When one of the pre-programming pulses Vppls1~VPPls4 are applied to one of the groups GR1~GR4, an inhibit voltage having the power supply voltage Vcc level is applied to the bitlines connected to the multi-level cells included in other groups.

As described above, in a method of programming at least three-bit data in a nonvolatile memory device according to some example embodiments, threshold voltage distributions of some of the multi-level cells are moved in advance by performing pre-programming operation, and a threshold voltage distribution of the multi-level cells having the erased state E0 is moved by performing the main programming operation. Therefore, an increase of the threshold voltage distribution of the multi-level cells having the erased state E0 due to the coupling effect of the multi-level cells having other states may be reduced. In addition, when the pre-programming operation is performed, the intermediate states are divided into a plurality of groups and the pre-programming pulses having different levels are applied to respective groups.

Figure 7A:
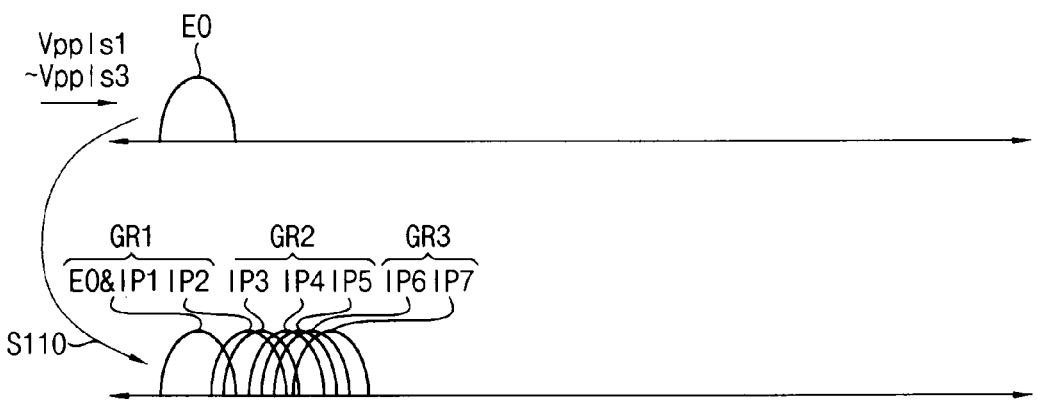
FIG. 7A is a diagram illustrating an example of threshold voltage distributions of multi-levels cells when the pre-programming operation is performed by a programming method according to example embodiments.

FIG. 7A is a diagram illustrating an example of threshold voltage distributions of multi-levels cells when the pre-programming operation is performed by a programming method according to example embodiments.

Figure 7B:
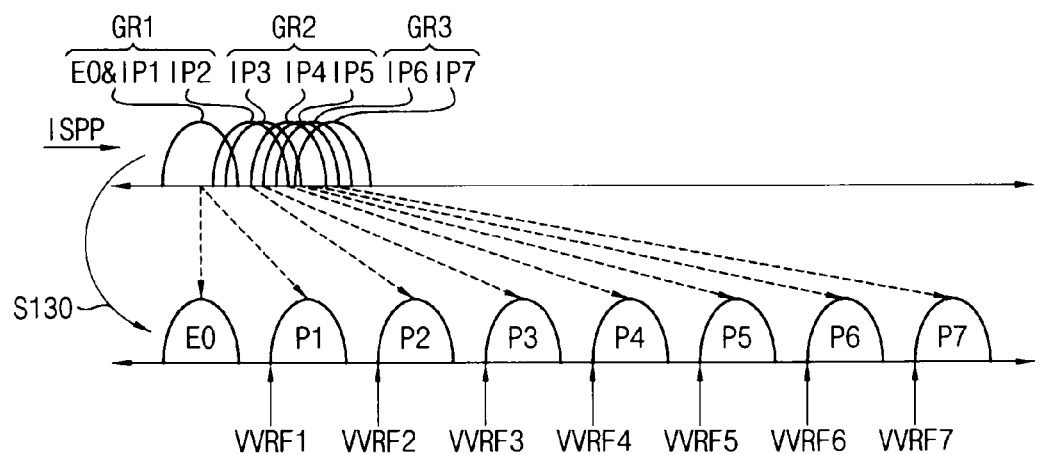
FIG. 7B is a diagram illustrating an example of threshold voltage distributions of multi-levels cells when the main programming operation is performed by a programming method according to example embodiments.

FIG. 7B is a diagram illustrating an example of threshold voltage distributions of multi-levels cells when the main programming operation is performed by a programming method according to example embodiments.

In FIGS. 7A and 7B, three-bit data are programmed into each multi-level cell.

Referring to FIGS. 1, 4 and 7A, a pre-programming operation is performed (S 110) by applying the pre-programming pulses Vppls1~Vppls3 to the multi-level cells having the erased state E0 such that at least some of the multi-level cells are programmed to a plurality of intermediate states which are different from an erased state, and at least some of the intermediate states have threshold voltage distributions that partially overlap with each other. When the pre-programming operation is performed, the multi-level cells have an erased state E0 and first through seventh intermediate states IP1~IP7 according to the target program state to be programmed. The threshold voltage distribution of the first intermediate state IP1 is the same as the threshold voltage distribution of the erased state E0. The threshold voltage distribution of the second intermediate state IP2 is greater than the threshold voltage distribution of the first intermediate state IP1, the threshold voltage distribution of the third intermediate state IP3 is greater than the threshold voltage distribution of the second intermediate state IP2, the threshold voltage distribution of the fourth intermediate state IP4 is greater than the threshold voltage distribution of the third intermediate state IP3, the threshold voltage distribution of the fifth intermediate state IP5 is greater than the threshold voltage distribution of the fourth intermediate state IP4, the threshold voltage distribution of the sixth intermediate state IP6 is greater than the threshold voltage distribution of the fifth intermediate state IP5, and the threshold voltage distribution of the seventh intermediate state IP7 is greater than the threshold voltage distribution of the sixth intermediate state IP6. That is, the second through seventh intermediate states IP2~IP7 have threshold voltage distributions which are different from the erased state E0, and at least some of the second through seventh intermediate states IP2~IP7 have threshold voltage distributions that partially overlap with each other.

The plurality of intermediate states E0 and IP1~IP7 may be divided into a plurality of groups GR1~GR3 according to target program states to be programmed (S111). The first group GR1 may include the erased state E0, the first intermediate state IP1 and the second intermediate state IP2, the second group GR2 may include the third intermediate state IP3, the fourth intermediate state IP4 and the fifth intermediate state IP5, and the third group GR4 may include the sixth intermediate state IP6 and the seventh intermediate state IP7. While the pre-programming pulses Vppls1~Vpplse are applied to the groups GR1~GR3, corresponding bitline forcing voltages are applied to the bitlines connected to the multi-level cells according to the corresponding intermediate states of the multi-level cells included in the respective groups GR1~GR3. Since the intermediate states E0 and IP1~IP7 are divided into three groups GR1~GR3, the pre-programming pulses Vppls1~Vppls3 are applied to the multi-level cells three times.

Referring to FIG. 7B, when the main programming operation is performed (S130) by applying ISPP to the multi-level cells, the multi-level cells have one of an erased state E0, a first program state P1, a second program state P2, a third program state P3, a fourth program state P4, a fifth program state P5, a sixth program state P6 and a seventh program state P7 according to the multi-bit data. For example, by the main programming operation, the multi-level cells having the first intermediate state IP1 may be programmed to the first program state P1 corresponding to a first verify voltage VVRF1, the multi-level cells having the second intermediate state IP2 may be programmed to the second program state P2 corresponding to a second verify voltage VVRF2, the multi-level cells having the third intermediate state IP3 may be programmed to the third program state P3 corresponding to a third verify voltage VVRF3, the multi-level cells having the fourth intermediate state IP4 may be programmed to the fourth program state P4 corresponding to a fourth verify voltage VVRF4, the multi-level cells having the fifth intermediate state IP5 may be programmed to the fifth program state P5 corresponding to a fifth verify voltage VVRF5, the multi-level cells having the sixth intermediate state IP6 may be programmed to the sixth program state P6 corresponding to a sixth verify voltage VVRF3, and the multi-level cells having the seventh intermediate state IP7 may be programmed to the seventh program state P7 corresponding to a seventh verify voltage VVRF7.

For example, the erased state E0, the first program state P1, the second program state P2, the third program state P3, the fourth program state P4, the target program state P5, the target program state P6 and the seventh program state P7 may correspond to the multi-bit data "111", "011", "001", "101", "100", "000", "010" and "110", respectively, but are not limited thereto. According to example embodiments, various logic vales of the multi-bit data may be allocated to the respective program states E0, P1, P2, P3, P4, P5, P6 and P7.

Figure 8:
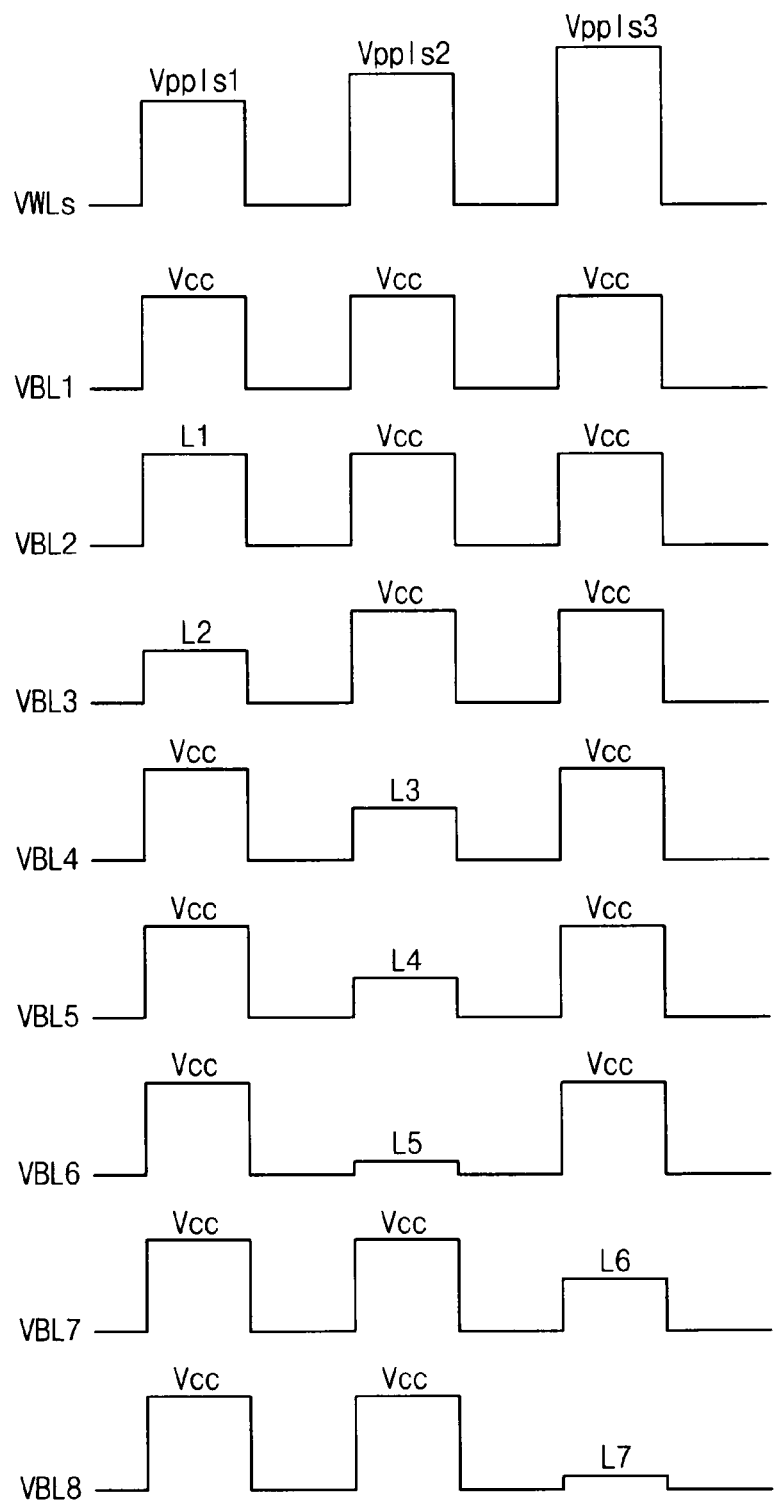
FIG. 8 illustrates voltages applied when the pre-programming operation of FIG. 7A is performed.

FIG. 8 illustrates voltages applied when the pre-programming operation of FIG. 7A is performed.

Referring to FIGS. 1, 4, 7A and 8, while the pre-programming operation is performed, the pre-programming pulses Vppls1~Vppls3 are applied to the multi-level cells connected to a selected wordline WLs as a wordline voltage VWLs, and bitline forcing voltages having a power supply voltage Vcc level or first through seventh levels L1~L7, according to respective intermediate states, are applied to the bitlines as bitline voltages VBL1~VBL8. The inhibit voltage VBL1 having a power supply voltage Vcc level is applied to the bitlines connected to the multi-level cells having the erased state E0, a bitline forcing voltage VBL2 having the first level L1 which is the same as the power supply voltage Vcc is applied to the bitlines connected to the multi-level cells having the first intermediate state IP1, a bitline forcing voltage VBL3 having the second level L2 which is less than first level L1 is applied to the bitlines connected to the multi-level cells having the second intermediate state IP2, a bitline forcing voltage VBL4 having a third level L3 which is less than the second level L2 is applied to the bitlines connected to the multi-level cells having the third intermediate state IP3, a bitline forcing voltage VBL5 having a fourth level L4 which is less than the third level L3 is applied to the bitlines connected to the multi-level cells having the fourth intermediate state IP4, a bitline forcing voltage VBL6 having a fifth level L5 which is less than the fourth level L4 is applied to the bitlines connected to the multi-level cells having the fifth intermediate state IP5, a bitline forcing voltage VBL7 having a sixth level L6 which is less than the fifth level L5 is applied to the bitlines connected to the multi-level cells having the sixth intermediate state IP6 and a bitline forcing voltage VBL8 having a seventh level L7 which is less than the sixth level L6 is applied to the bitlines connected to the multi-level cells having the seventh intermediate state IP7. The second through seventh levels L2~L7 are between the power supply voltage Vcc level and the ground voltage level. When one of the pre-programming pulses Vppls1~VPPls4 are applied to one of the groups GR1~GR3, an inhibit voltage having the power supply voltage Vcc level is applied to the bitlines connected to the multi-level cells included in other groups.

As described above, in a method of programming at least three-bit data in a nonvolatile memory device according to some example embodiments, threshold voltage distributions of some of the multi-level cells are moved in advance by performing a pre-programming operation, and a threshold voltage distribution of the multi-level cell having the erased state E0 is moved by performing the main programming operation. Therefore, an increase of threshold voltage distribution of the multi-level cell having the erased state E0 due to a coupling effect of the multi-level cells having other states may be reduced. In addition, when the pre-programming operation is performed, the intermediate states are divided into a plurality of groups and the pre-programming pulses having different levels are applied to respective groups.

According to some example embodiments, the intermediate states may be divided into two groups each including four intermediate states.

Figure 9:
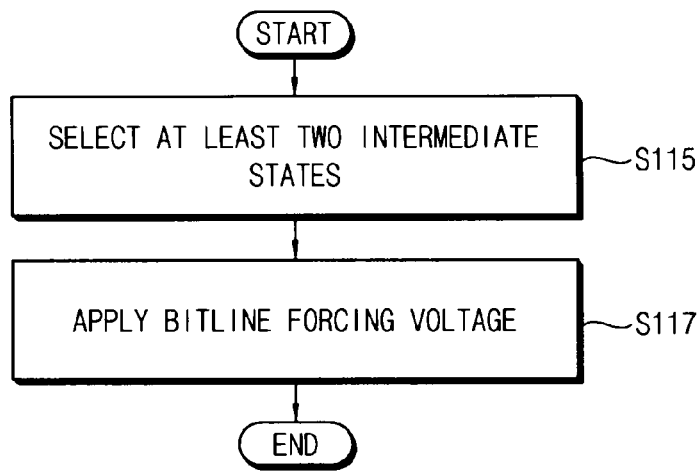
FIG. 9 is a flowchart illustrating the step of performing the pre-programming operation in FIG. 1 according to other example embodiments.

FIG. 9 is a flowchart illustrating the step of performing the pre-programming operation in FIG. 1 according to other example embodiments.

Referring to FIG. 9, for performing the pre-programming operation, at least two intermediate states which are different from the erased state are selected (S115). That is, the at least two intermediate states may be selected for programming to at least some of the plurality of intermediate states but not all of the intermediate states. While the pre-programming pulses are applied to the multi-level cells included in the selected intermediate states, the bitline forcing voltages are applied to the bitlines connected to the multi-level cells according to respective selected intermediate states of the multi-level cells (S 117). After the pre-programming operation is performed which programs the multi-level cells to the at least two intermediate states, the main programming operation is performed which programs the multi-level cells to the program states corresponding to the multi-bit data.

Figure 10:
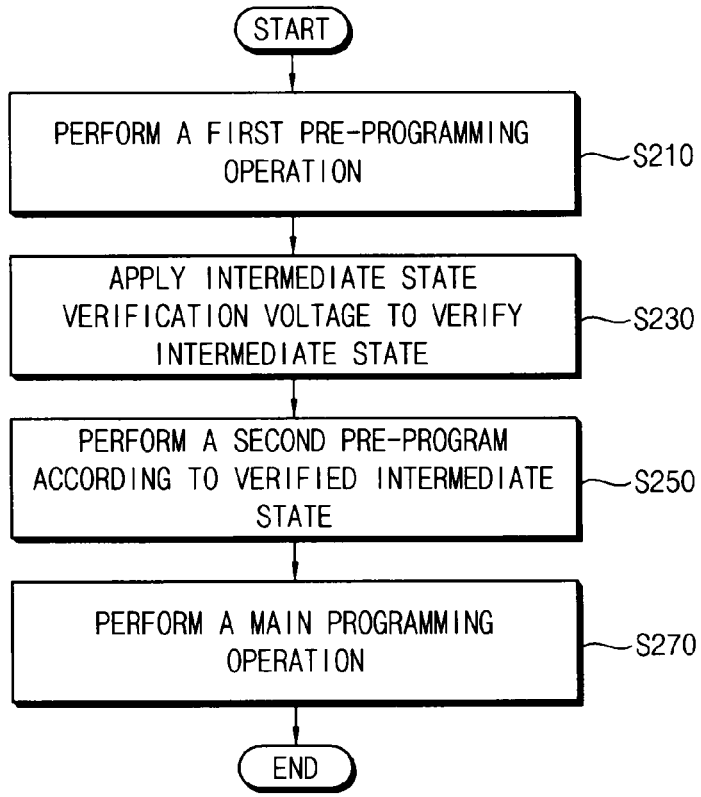
FIG. 10 is a flowchart illustrating a method of programming a nonvolatile memory device according to other example embodiments.

FIG. 10 is a flowchart illustrating a method of programming a nonvolatile memory device according to other example embodiments.

Referring to FIG. 10, in a nonvolatile memory device including multi-level cells that store multi-bit data, a first pre-programming operation is performed which programs the multi-level cells to a plurality of intermediate states (S210). Here, the multi-bit data indicate data which has more than one bit, and the multi-level cells indicate nonvolatile memory cells storing more than one bit of data per memory cell.

For example, the first pre-programming operation may be performed by applying bitline forcing voltages with different levels to bitlines connected to the multi-level cells while applying a first pre-programming pulse to the multi-level cells.

For example, when the target program state to be programmed is an erased state, an inhibit voltage having a power supply voltage level is applied to a bitline connected to the multi-level cell to be programmed to the erased state. For example, when the target program state to be programmed is the highest state whose threshold voltage distribution is farthest from the erased state, a bitline forcing voltage having a ground voltage level (OV) is applied to a bitline connected to the multi-level cell, and the multi-level cell is pre-programmed to one of the intermediate states.

For example, when the target program state to be programmed is a state between the erased state and the highest state, a bitline forcing voltage having a voltage level between the power supply voltage and the ground voltage is applied to a bitline connected to the multi-level cell, and the multi-level cell is pre-programmed to one of the intermediate states.

After the first pre-programming operation is performed, the intermediate states of the multi-level cells are verified by applying intermediate state verify voltages to the multi-level cells (S230).

A second pre-programming operation is selectively performed based on the verification result (S250). The first pre-programming operation may be selectively performed by applying bitline forcing voltages with different levels to bitlines connected to the multi-level cells according to the intermediate states while applying a second pre-programming pulse to the multi-level cells which are programmed under the intermediate state verify voltage. The level of the second pre-programming pulse may be less than the level of the first pre-programming pulse.

After the second pre-programming operation is performed, a main programming operation is performed which programs the multi-level cells to a plurality of target states corresponding to the multi-bit data (S270). In some embodiments, the main programming operation may be performed using an incremental step pulse programming (ISPP) method. For example, to perform the main programming operation, an incremental step pulse, which increases by a predetermined voltage level per programming loop, may be applied to the multi-level cells, and verify voltages corresponding to the multi-bit data may be applied to verify whether the multi-bit data are properly programmed in the multi-level cells.

As described above, in a method of programming a nonvolatile memory device according to some example embodiments, the main programming operation is performed after the pre-programming operation that programs the multi-level cells to intermediate program states which are different from an erased state by applying bitline forcing voltages to the bitlines connected to the multi-level cells while applying pre-programming pulse to the multi-level cells, thereby reducing the increase in width of threshold voltage distributions due to coupling or a disturbance, and reducing programming overhead due to applying the pre-programming pulse once.

Figure 11:
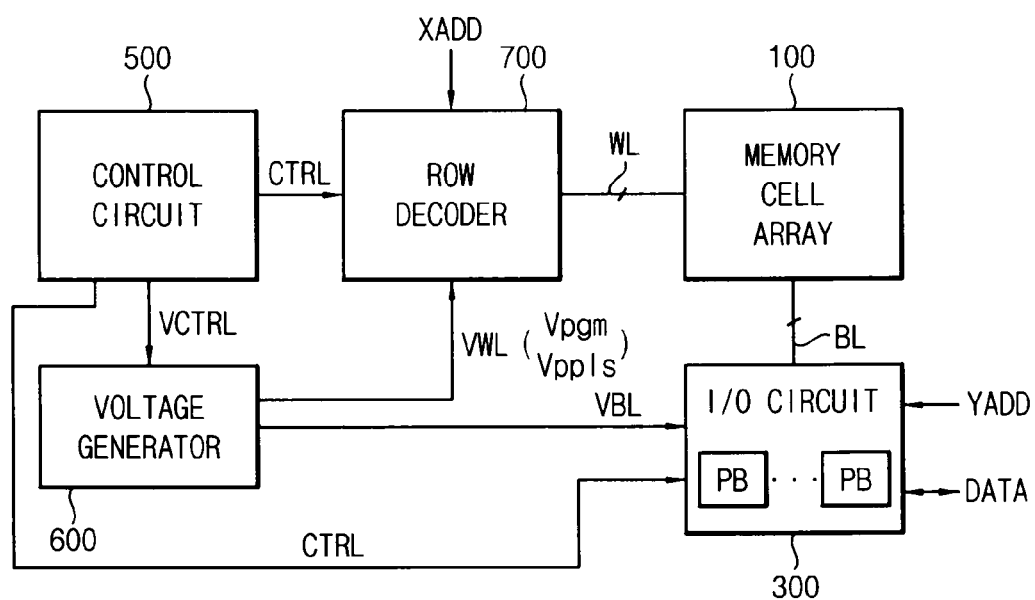
FIG. 11 is a block diagram illustrating a nonvolatile memory device according to some example embodiments.

FIG. 11 is a block diagram illustrating a nonvolatile memory device according to some example embodiments.

Referring to FIG. 11, a nonvolatile memory device 10 includes a memory cell array 100, a row decoder 700, an input/output (I/O) circuit 300, a control circuit 500 and a voltage generator 600.

Memory cell array 100 includes a plurality of memory cells each of which is connected to a respective one of wordlines WL and a respective one of bitlines BL. As will be described below with reference to FIGS. 12 through 13, the plurality of memory cells may include NAND flash memory cells or NOR flash memory cells, and may be arranged in a two-dimensional (2-D) array structure or a three-dimensional (3-D) vertical array structure (e.g., a vertical memory device having a stacked structure).

In an example embodiment, the plurality of memory cells may include either single-level memory cells (SLC) in which only one bit is stored in each memory cell, or multi-level memory cells (MLC) in which more than two bits are stored in each memory cell. In the MLC, the memory cells may be programmed using various programming methods, such as a shadow programming scheme, a reprogramming scheme or an on-chip buffered programming scheme.

Row decoder 700 may select a wordline in response to a row address XADD. Row decoder 700 may apply wordline voltages VWL from voltage generator 600 to selected and non-selected wordlines in response to a voltage control signal VCTRL from control circuit 500. During a programming operation, row decoder 700 may apply a programming voltage to the selected wordline, and may apply a pass voltage to the non-selected wordlines.

I/O circuit 300 is connected to the bitlines BL and stores write data to be programmed into memory cell array 100 or read data sensed from memory cell array 100. I/O circuit 300 includes a plurality of page buffers PB corresponding to the bitlines BL and may further include a column decoder which selects the bitline based on a column address YADD. Each of the page buffers PB may include a plurality of data latches, and each of the page buffers PB may operate as a write driver or a sense amplifier according to an operating mode of the nonvolatile memory device.

I/O circuit 300 performs write operations and read operations in response to a control signal CTRL from control circuit 500. I/O circuit 300 loads write date and a program pass voltage or a program inhibit voltage to respective bitlines based on the write data in a programming operation during a write mode, and performs verify operation for verifying whether the programming is successfully performed. I/O circuit 300 senses voltages of the bitlines and outputs the read data in a read mode. When 110 circuit 300 performs the write operation, 110 circuit 300 programs multi-bit data into memory cell array 100 by performing the pre-programming operation and the main programming operation. When 110 circuit 300 performs the pre-programming operation, the bitline forcing voltages corresponding to the intermediate states to be programmed may be applied to the bitlines connected to the multi-level cells while the pre-programming pulse is applied to the multi-level cells.

Control circuit 500 generates the control signal CTRL for controlling overall operation of nonvolatile memory device 10 and the voltage control signal VCTRL for controlling voltage generator 600. For example, the voltage control signal VCTRL may include information for controlling the pre-programming pulse and the bitline forcing voltages.

Voltage generator 600 generates a wordline voltage VWL and a bitline voltage VBL in response to the voltage control signal VCTRL. The wordline voltage VWL, which is provided to row decoder 700, may include a program voltage Vpgm, a pre-program pulse Vppls, verify voltage, read voltage and erase voltage according to operation modes. The bitline voltage VBL, which is provided to 110 circuit 300 may include a bitline forcing voltage, a program pass voltage, program inhibit voltage and a precharge voltage.

Figure 12:
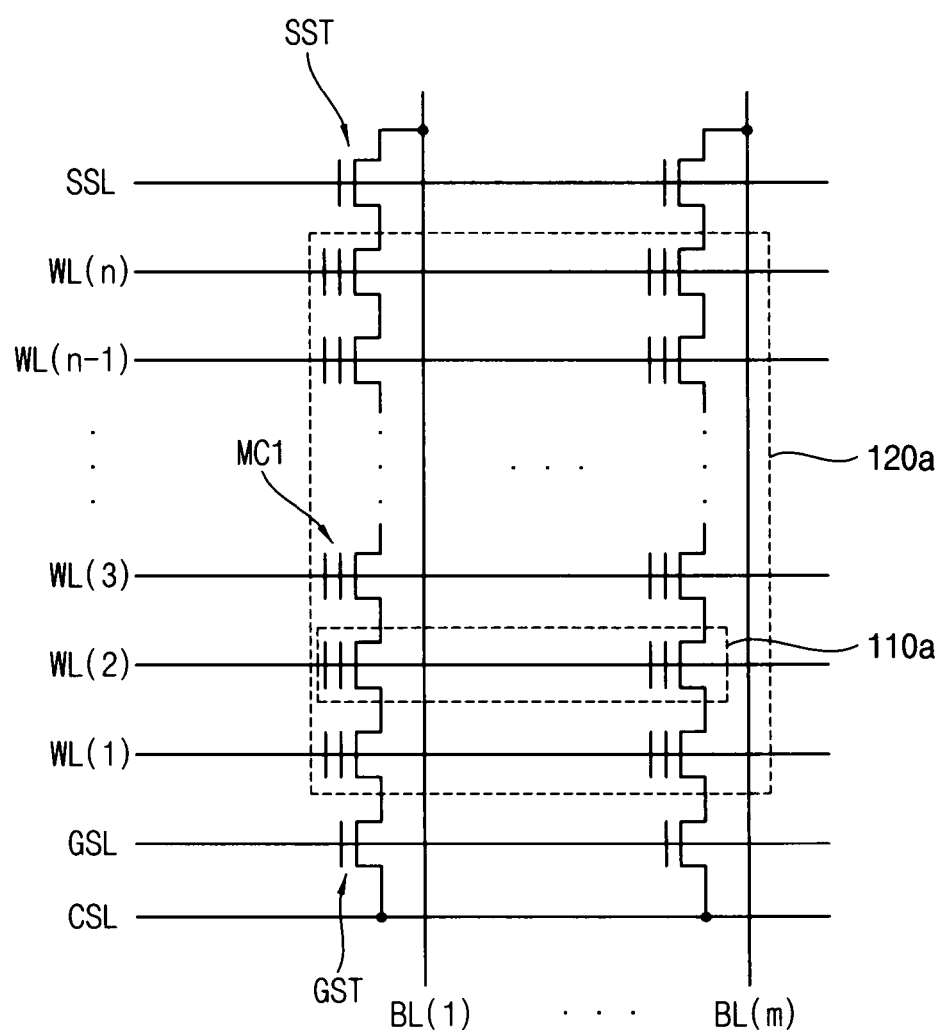
FIG. 12 is a circuit diagram illustrating an example embodiment of a memory cell array in FIG. 11.

FIG. 12 is a circuit diagram illustrating an example embodiment of a memory cell array in FIG. 11.

Referring to FIG. 12, memory cell array 100a may include string select transistors SST, ground select transistors GST and a plurality of memory cells MC1. The string select transistors SST may be connected to bitlines BL(1), ..., BL(m), and the ground select transistors GST may be connected to a common source line CSL. The memory cells MC 1 may be connected in series between the string select transistors SST and the ground select transistors GST. Memory cells in the same row may be connected to the same wordline among wordlines WL(1), ..., WL(n). For example, 16, 32 or 64 wordlines may be disposed between a string select line SSL and a ground select line GSL.

The string select transistors SST may be connected to the string select line SSL, and may be controlled by a voltage on the string select line SSL. The ground select transistors GST may be connected to the ground select line GSL, and may be controlled by a voltage on the ground select line GSL. The memory cells MC1 may be controlled by a voltage on the wordlines WL(1), ..., WL(n).

In the NAND flash memory device including memory cell array 100a, a read operation and a programming operation may be performed per page 110a, and an erase operation may be performed per block 120a. According to example embodiments, each page buffer PB of FIG. 11 may be connected to an odd-numbered bitline and an even-numbered bitline. In this case, the odd-numbered bitlines may form odd-numbered pages, the even-numbered bitlines may form even-numbered pages, and programming operations for the odd-numbered pages and the even-numbered pages may be alternately performed.

Figure 13:
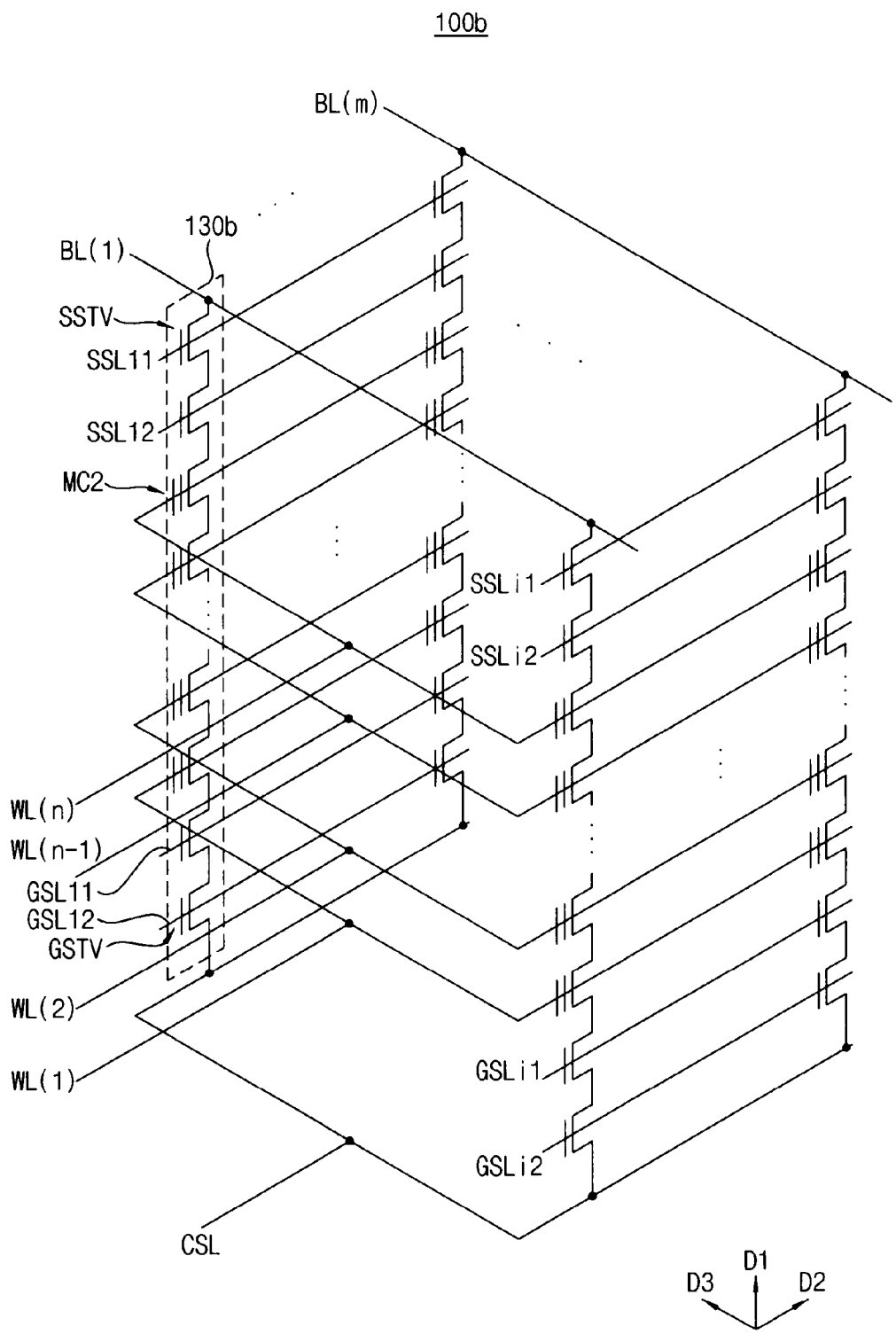
FIG. 13 is a circuit diagram illustrating an example embodiment of a memory cell array in FIG. 11.

FIG. 13 is a circuit diagram illustrating an example embodiment of a memory cell array in FIG. 11.

Referring to FIG. 13, a memory cell array 100b may include a plurality of strings 130b each of which has a vertical structure. The plurality of strings 130b may be formed in a second direction to define a string column, and a plurality of string columns may be formed in a third direction to define a string array. Each string may include string select transistors SSTV, ground select transistors GSTV, and a plurality of memory cells MC2 that are formed in a first direction D1 and are connected in series between the string select transistors SSTV and the ground select transistors GSTV.

The string select transistors SSTV may be connected to bitlines BL(1), ..., BL(m), and the ground select transistors GST may be connected to a common source line CSL. The string select transistors SSTV may be connected to string select lines SSL11, SSL12, ..., SSLi1, SSLi2, and the ground select transistors GSTV may be connected to ground select lines GSL11, GSL12, ..., GSLi1, GSLi2. The memory cells in the same layer may be connected to the same wordline among wordlines WL(1), WL(2), ... WL(n-1), WL(n). Each string select line and each ground select line may extend in the second direction D2, and the string select lines SSL11, ..., SSLi2 and the ground select lines GSL11, ..., GSLi2 may be formed in the third direction D3. Each wordline may extend in the second direction D2, and the wordlines WL(1), ..., WL(n) may be formed in the first direction D1 and the third direction D3. Each bitline may extend in the third direction D3, and the bitlines BL(1), ..., BL(m) may be formed in the second direction D2. The memory cells MC2 may be controlled by a voltage on the wordlines WL(1), ..., WL(n).

Similarly to the NAND flash memory device, in the vertical flash memory device including memory cell array 100b, a read operation and a programming operation may be performed per page, and an erase operation may be performed per block.

Although not illustrated in FIG. 13, according to example embodiments, two string select transistors included in a single string may be connected to a single string select line, and two ground select transistors included in the single string may be connected to a single ground select line. According to example embodiments, the single string may include one string select transistor and one ground select transistor.

Figure 14:
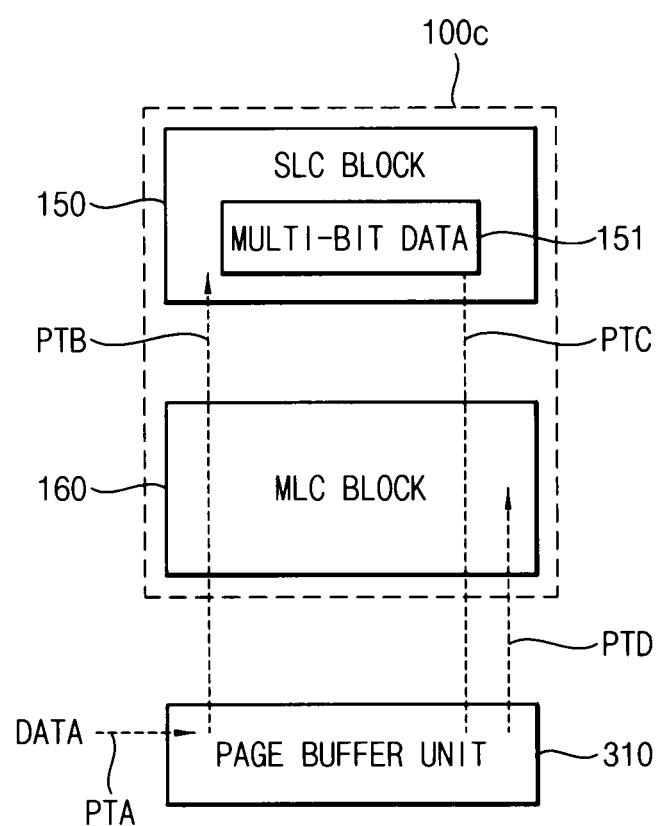
FIG. 14 is a diagram for describing on-chip buffered programming in a nonvolatile memory device according to example embodiments.

FIG. 14 is a diagram for describing on-chip buffered programming (OBP) in a nonvolatile memory device according to example embodiments.

In FIG. 14, a memory cell array 100c and a page buffer unit 310 are illustrated. Page buffer unit 310 may be included in I/O circuit 300 in FIG. 11. Page buffer unit 310 may include the page buffers PB in FIG. 11.

Referring to FIG. 14, the memory cell array includes at least one single level cell block 150 and at least one multi-level cell block 160. Multi-level cell block 160 may include a plurality of multi-level cells respectively connected to bitlines and wordlines. Each of the multi-level cells may store multi-bit data having two or more bits. Single level cell block 150 may store multi-bit data 151 provided from an external device. Single level cell block 150 operating at relatively high speed and having relatively low cell density may store one bit per memory cell. However, multi-level cell block 160 operating at relatively low speed and having relatively high cell density may store two or more bits per memory cell.

In the normal programming operation of the NAND flash memory device using the on-chip buffered programming method, if the page data DATA are input from an external device (not shown), the page data DATA may be loaded into the page buffers included in page buffer unit 310 in the minimum unit of programming (PTA), and then the page data DATA may be loaded in single level cell block 150 of memory cell array 100c (PTB). In some embodiments, an interleaving operation may be performed on the page data DATA input from the external device, the page data DATA on which the interleaving operation is performed may be loaded into the page buffers included in page buffer unit 310 in the minimum unit of programming (PTA), and then the page data DATA may be loaded in single level cell block 150 of memory cell array 100c (PTB). The minimum unit of programming may be set according to various conditions, such as type of the programming method, the number of bits per cell, whether the interleaving operation is performed, etc. For example, in the case where the interleaving operation is not performed, the minimum unit of programming may correspond to one page data DATA.

After the page data DATA are loaded into single level cell block 150, the page data DATA in single level cell block 150 may be again loaded into the page buffers included in page buffer unit 310 (PTC). The minimum unit of programming of the page buffer unit may be greater than the minimum unit of programming of the single level memory cell block.

The nonvolatile memory device of FIG. 14 programs the multi-bit data from the external device into single level cell block 150 and the multi-bit data in single level cell block 150 may be programmed again into multi-level cell block 160. That is, the nonvolatile memory device of FIG. 14 may perform the OBP which uses single level cell block 150 as buffers.

Figure 15:
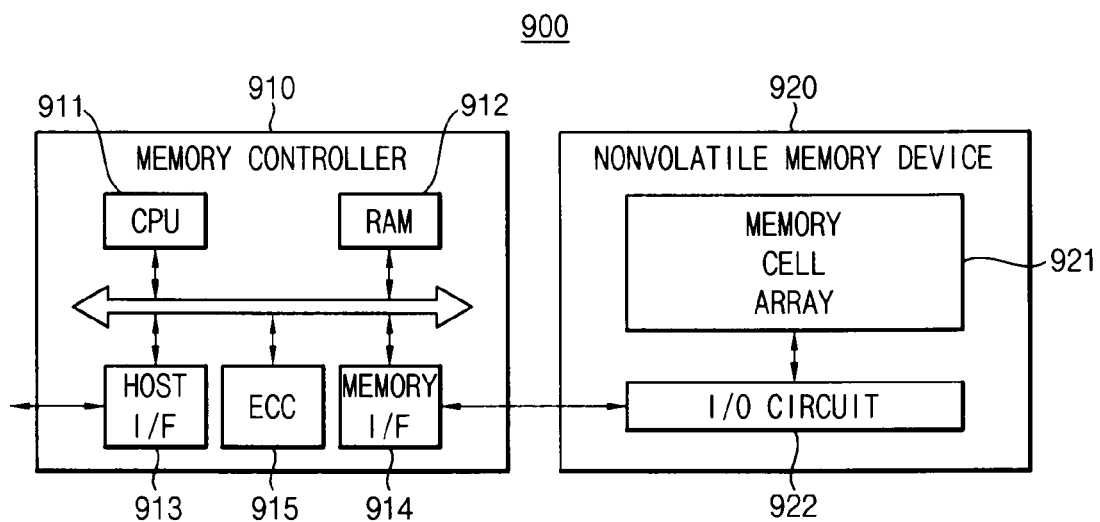
FIG. 15 is a block diagram illustrating a memory system according to example embodiments.

FIG. 15 is a block diagram illustrating a memory system according to example embodiments.

Referring to FIG. 15, a memory system 900 includes a memory controller 910 and a nonvolatile memory device 920.

Nonvolatile memory device 920 includes a memory cell array 921 and an I/O circuit 922. I/O circuit 922 may include page buffers that are coupled to bitlines, and may store data to be written in memory cell array 921 or data read out from memory cell array 921. Memory cell array 921 may include memory cells coupled to wordlines and the bitlines. Memory cell array 921 may include multi-level cells storing multi-bit data.

Memory controller 910 may control nonvolatile memory device 920. Memory controller 910 may control data transfer between an external host (not illustrated) and nonvolatile memory device 920. Memory controller 910 may include a central processing unit 911, a buffer memory 912, a host interface 913 and a memory interface 914. Central processing unit 911 may perform operations for the data transfer. Buffer memory 912 may be implemented by a dynamic random access memory (DRAM), a static random access memory (SRAM), a PRAM, a FRAM, a RRAM, a MRAM, etc. According to example embodiments, buffer memory 912 may be located inside or outside memory controller 910.

Host interface 913 may be coupled to the host, and memory interface 914 may be coupled to nonvolatile memory device 920. Central processing unit 911 may communicate with the host via host interface 913. For example, host interface 913 may be configured to communicate with the host using at least one of various interface protocols, such as a universal serial bus (USB), a multimedia card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), etc. Further, central processing unit 911 may communicate with nonvolatile memory device 920 via memory interface 914. In some example embodiments, memory controller 910 may further include an error correction block 915 for error correction. According to example embodiments, memory controller 910 may be built into nonvolatile memory device 920, or memory controller 910 and nonvolatile memory device 920 may be implemented as separate chips.

Memory system 900 may be implemented as a memory card, a solid state drive, etc. In some embodiments, nonvolatile memory device 920, memory controller 910 and/or memory system 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 16:
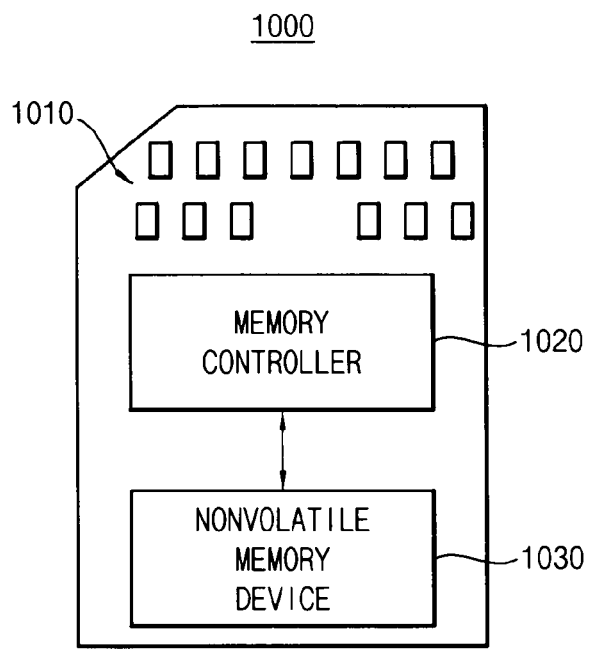
FIG. 16 is a diagram illustrating a memory card including a memory system according to example embodiments.

FIG. 16 is a diagram illustrating a memory card including a memory system according to example embodiments.

Referring to FIG. 16, a memory card 1000 may include a plurality of connecting pins 1010, a memory controller 1020 and a nonvolatile memory device 1030.

Connecting pins 1010 may be coupled to a host (not illustrated) to transfer signals between the host and memory card 1000. Connecting pins 1010 may include a clock pin, a command pin, a data pin and/or a reset pin.

Memory controller 1020 may receive data from the host, and may store the received data in nonvolatile memory device 1030.

Nonvolatile memory device 1030 may include multi-level cells, and may perform a pre-programming operation which programs at least some of the multi-level cells to a plurality of intermediate states which are different from an erased state and then perform a main programming operation which programs the multi-level cells to a plurality of target states corresponding to the multi-bit data. When nonvolatile memory device 1030 performs the pre-programming operation, the bitline forcing voltages with different levels according to the intermediate states to be programmed are applied to bitlines connected to the multi-level cells while a pre-programming pulse is applied to the multi-level cells.

For example, memory card 1000 may include a MMC, an embedded MMC (eMMC), a hybrid embedded MMC (hybrid eMMC), a secure digital (SD) card, a micro-SD card, a memory stick, an ID card, a personal computer memory card international association (PCMCIA) card, a chip card, a USB card, a smart card, a compact flash (CF) card, etc.

In some embodiments, memory card 1000 may be coupled to the host, such as a desktop computer, a laptop computer, a tablet computer, a mobile phone, a smart phone, a music player, a personal digital assistants (PDA), a portable multimedia player (PMP), a digital television, a digital camera, a portable game console, etc.

Figure 17:
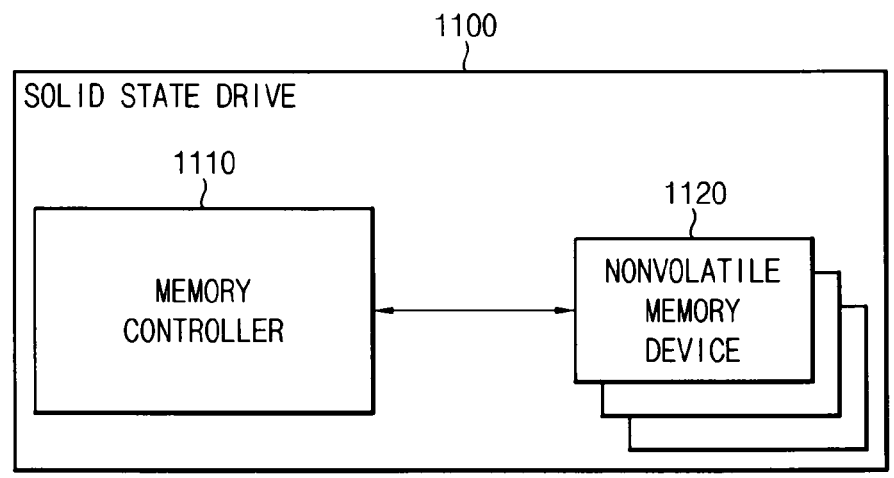
FIG. 17 is a diagram illustrating a solid state drive including a memory system according to example embodiments.

FIG. 17 is a diagram illustrating a solid state drive including a memory system according to example embodiments.

Referring to FIG. 17, a solid state drive (SSD) 1100 includes a memory controller 1110 and a plurality of nonvolatile memory devices 1120.

Memory controller 1110 may receive data from a host (not illustrated). Memory controller 1110 may store the received data in the plurality of nonvolatile memory devices 1120.

Nonvolatile memory device 1120 may include multi-level cells, and performs a pre-programming operation which programs at least some of the multi-level cells to a plurality of intermediate states distinct from an erased state and then performs a main programming operation which programs the multi-level cells to a plurality of target states corresponding to the multi-bit data. When nonvolatile memory device 1120 performs the pre-programming operation, the bitline forcing voltages with different levels according to the intermediate states to be programmed are applied to bitlines connected to the multi-level cells while a pre-programming pulse is applied to the multi-level cells.

In some embodiments, solid state drive 1100 may be coupled to the host, such as a mobile device, a mobile phone, a smart phone, a PDA, a PMP, a digital camera, a portable game console, a music player, a desktop computer, a notebook computer, a tablet computer, a speaker, a video, a digital television, etc.

Figure 18:
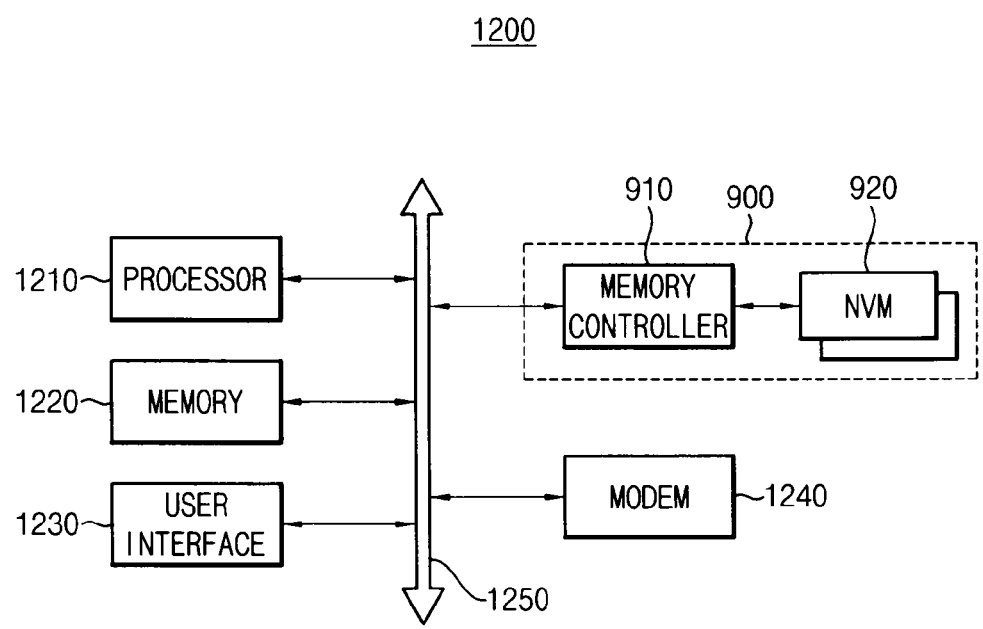
FIG. 18 is a diagram illustrating a computing system according to example embodiments.

FIG. 18 is a diagram illustrating a computing system according to example embodiments.

Referring to FIG. 18, a computing system 1200 includes a processor 1210, a memory 1220, a user interface 1230 and a memory system 900. In some embodiments, computing system 1200 may further include a modem 1240, such as a baseband chipset.

Processor 1210 may perform various computing functions, such as executing specific software for performing specific calculations or tasks. For example, processor 1210 may be a microprocessor, a central processing unit (CPU), a digital signal processor, or the like. Processor 1210 may be coupled to memory 1220 via a bus 1250, such as an address bus, a control bus and/or a data bus. For example, memory 1220 may be implemented by a DRAM, a mobile DRAM, a SRAM, a PRAM, a FRAM, a RRAM, a MRAM and/or a flash memory. Further, processor 1210 may be coupled to an extension bus, such as a peripheral component interconnect (PCI) bus, and may control user interface 1230 including at least one input device, such as a keyboard, a mouse, a touch screen, etc., and at least one output device, a printer, a display device, etc. Modem 1240 may perform wired or wireless communication with an external device. Nonvolatile memory device(s) 920 may be controlled by a memory controller 910 to store data processed by processor 1210 or data received via modem 1240. In some embodiments, computing system 1200 may further include a power supply, an application chipset, a camera image processor (CIS), etc.

Nonvolatile memory devices 920 may include multi-level cells.

Volatile memory device 1430 may store an instruction/data processed by application processor 1410, or may serve as a working memory. For example, volatile memory device 1430 may be implemented by a DRAM, a SRAM, a mobile DRAM, or the like.

Nonvolatile memory device 1440 may store a boot image for booting mobile system 1400. For example, nonvolatile memory device 1440 may be implemented by an electrically erasable programmable read-only memory (EEPROM), a flash memory, a PRAM, a RRAM, a MRAM, a FRAM, a nano floating gate memory (NFGM), a polymer random access memory (PoRAM), or the like. Nonvolatile memory device 1440 may include memory cells, and may perform a copyback programming operation by simultaneously derandomizing and randomizing first random data from a source area of the memory cell array to generate second random data, and programming the second random data to a target area of the memory cell array. Therefore, nonvolatile memory device 1440 may reduce a time required for the copyback programming operation and may reduce an overhead that may occur during the copyback programming operation.

Figure 19:
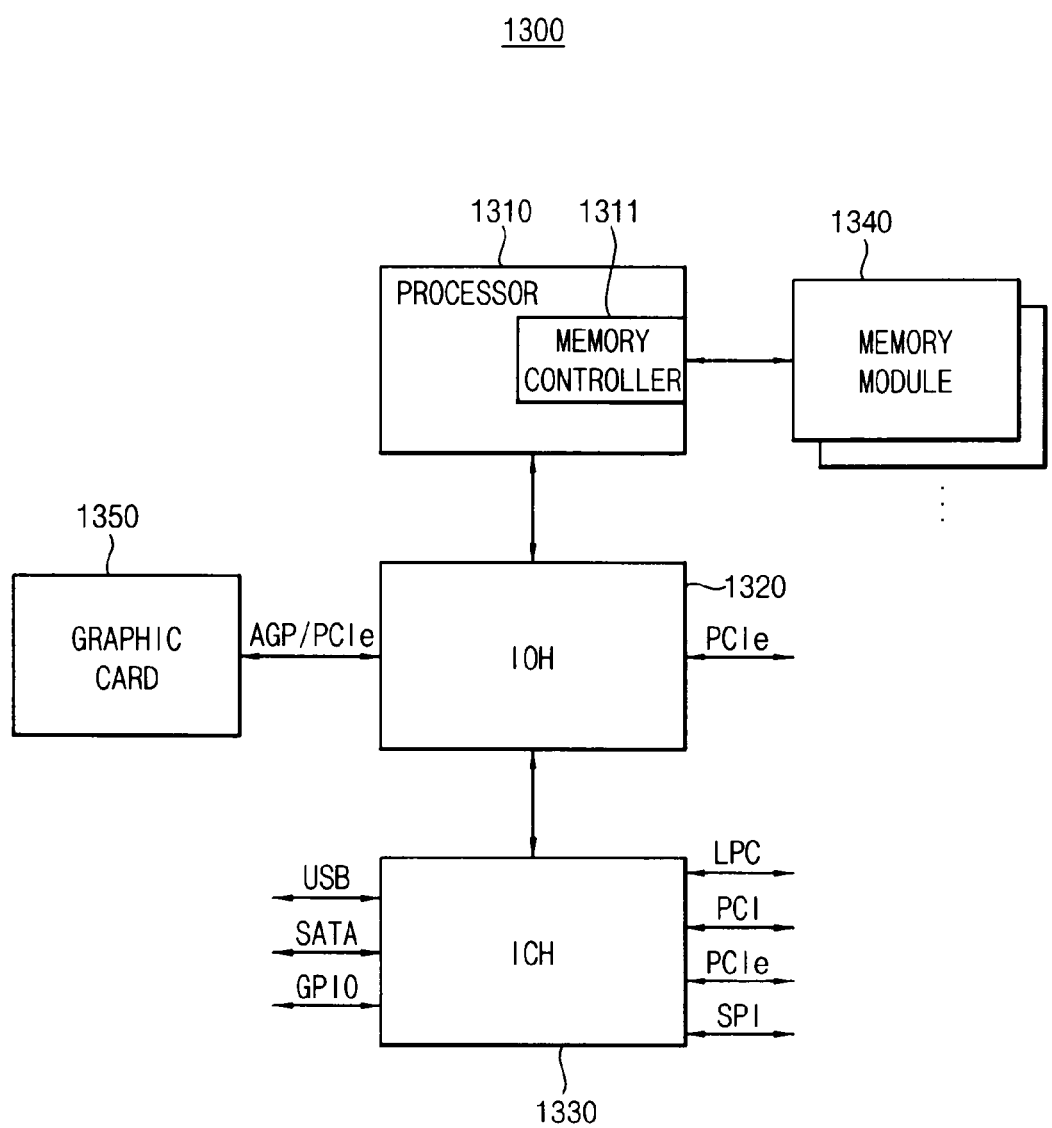
FIG. 19 is a diagram illustrating a computing system according to example embodiments.

FIG. 19 is a diagram illustrating a computing system according to example embodiments.

Referring to FIG. 19, a computing system 1300 includes a processor 1310, an I/O hub 1320, an I/O controller hub 1330, at least one memory module 1540 and a graphic card 1350. According to example embodiments, computing system 1300 may be any computing system, such as a personal computer (PC), a server computer, a workstation, a tablet computer, a laptop computer, a mobile phone, a smart phone, a PDA, a PMP, a digital camera, a digital television, a set-top box, a music player, a portable game console, a navigation device, etc.

Processor 1310 may perform specific calculations or tasks. For example, processor 1310 may be a microprocessor, a central processing unit (CPU), a digital signal processor (DSP), or the like. According to example embodiments, processor 1310 may include a single processor core or a plurality of processor cores. For example, processor 1310 may be a multi-core processor, such as a dual-core processor, a quad-core processor, a hexa-core processor, etc. Although FIG. 19 illustrates an example of computing system 1300 including one processor 1310, according to example embodiments, computing system 1300 may include a plurality of processors. In some example embodiments, processor 1310 may further include a cache memory located inside or outside processor 1310.

Processor 1310 may include a memory controller (not illustrated) that controls an operation of memory module 1340. The memory controller included in processor 1310 may be referred to as an integrated memory controller (IMC). A memory interface between the memory controller and memory module 1340 may be implemented by one channel including a plurality of signal lines, or by a plurality of channels. Each channel may be coupled to at least one memory module 1340. In some example embodiments, the memory controller may be included in I/O hub 1320. I/O hub 1320 including the memory controller may be referred to as a memory controller hub (MCH).

Memory module 1340 may include a plurality of nonvolatile memory devices that store data provided from memory controller 1311. The nonvolatile memory devices may include memory cells, and may perform a copyback programming operation by simultaneously derandomizing and randomizing first random data from a source area of the memory cell array to generate second random data, and programming the second random data to a target area of the memory cell array. Therefore, the nonvolatile memory devices may reduce a time required for the copyback programming operation and may reduce an overhead that may occur during the copyback programming operation.

I/O hub 1320 may manage data transfer between the processor 1310 and devices, such as graphic card 1350. I/O hub 1520 may be coupled to processor 1510 via at least one of various interfaces, such as a front side bus (FSB), a system bus, a HyperTransport, a lightning data transport (LDT), a QuickPath interconnect (QPI), a common system interface (CSI), etc. Although FIG. 19 illustrates an example of computing system 1300 including one I/O hub 1320, according to example embodiments, computing system 1300 may include a plurality of I/O hubs.

I/O hub 1320 may provide various interfaces with the devices. For example, I/O hub 1320 may provide an accelerated graphics port (AGP) interface, a peripheral component interface-express (PCIe), a communications streaming architecture (CSA) interface, etc.

Graphic card 1350 may be coupled to I/O hub 1320 via the AGP or the PCIe. Graphic card 1350 may control a display device (not illustrated) for displaying an image. Graphic card 1350 may include an internal processor and an internal memory to process the image. In some example embodiments, input/output hub 1320 may include an internal graphic device together with or instead of graphic card 1350. The internal graphic device may be referred to as an integrated graphics, and an I/O hub including the memory controller and the internal graphic device may be referred to as a graphics and memory controller hub (GMCH).

I/O controller hub 1330 may perform data buffering and interface arbitration to efficiently operate various system interfaces. I/O controller hub 1330 may be coupled to I/O hub 1320 via an internal bus. For example, I/O controller hub 1330 may be coupled to I/O hub 1320 via at least one of various interfaces, such as a direct media interface (DMI), a hub interface, an enterprise Southbridge interface (ESI), PCIe, etc.

I/O controller hub 1330 may provide various interfaces with peripheral devices. For example, I/O controller hub 1530 may provide a universal serial bus (USB) port, a serial advanced technology attachment (SATA) port, a general purpose input/output (GPIO), a low pin count (LPC) bus, a serial peripheral interface (SPI), a PCI, a PCIe, etc.

In some example embodiments, processor 1310, I/O hub 1320 and I/O controller hub 1330 may be implemented as separate chipsets or separate integrated circuits. In other embodiments, at least two of processor 1310, I/O hub 1320 and I/O controller hub 1330 may be implemented as one chipset.

The above described embodiments may be used in any device or system including a nonvolatile memory device, such as a mobile phone, a smart phone, a PDA, a PMP, a digital camera, a digital television, a set-top box, a music player, a portable game console, a navigation device, a PC, a server computer, a workstation, a tablet computer, a laptop computer, a smart card, a printer, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of programming a nonvolatile memory device including multi-level cells that store multi-bit data, the method comprising:
    performing a pre-programming operation that programs at least some of the multi-level cells to a plurality of intermediate states which are different from an erased state, at least some of the intermediate states having threshold voltage distributions that partially overlap each other; and
    performing a main programming operation that programs the multi-level cells to a plurality of target states corresponding to the multi-bit data.

2. The method of claim 1, wherein the pre-programming operation is performed by applying bitline forcing voltages with different levels to bitlines connected to the multi-level cells while applying a pre-programming pulse to the multi-level cells.

3. The method of claim 2, wherein the intermediate states include at least first, second, and third intermediate states, and wherein a threshold voltage distribution of the first intermediate state is substantially the same as a threshold voltage distribution of the erased state, a threshold voltage distribution of the second intermediate state is greater than the threshold voltage distribution of the erased state, and a threshold voltage distribution of the third intermediate state is greater than the threshold voltage distribution of the second intermediate state.

4. The method of claim 3, wherein an inhibit voltage having a power supply voltage level is applied to a multi-level cell having the erased state, a first bitline forcing voltage is applied to a multi-level cell having the first intermediate state, a second bitline forcing voltage is applied to a multi-level cell having the second intermediate state and a third bitline forcing voltage is applied to a multi-level cell having the third intermediate state, the first bit line forcing voltage having the power supply voltage level and the second and third bitline forcing voltages being between the power supply voltage level and a ground voltage level.

5. The method of claim 4, wherein the second bitline forcing voltage is greater than the third bitline forcing voltage.

6. The method of claim 2, wherein the pre-programming pulse is applied to the multi-level cells one time.

7. The method of claim 2, wherein the intermediate states include at least first through seventh intermediate states, and the pre-programming pulse is applied to the multi-level cells a plurality of times.

8. The method of claim 7, wherein performing the pre-programming operation comprises:
    dividing the erased state and the first through seventh intermediate states into a plurality of groups; and
    applying the bitline forcing voltages to bitlines connected to multi-level cells included in each of the groups while applying the preprogramming pulse to the multi-level cells in each group.

9. The method of claim 8, wherein a threshold voltage distribution of the first intermediate state is substantially the same as a threshold voltage distribution of the erased state, threshold distributions gradually increase from the second through the seventh intermediate states, and the pre-programming pulse applied to a group including multi-level cells having a greater threshold voltage distribution has a greater level than the pre-programming pulse applied to a group including multi-level cells having a lesser threshold voltage distribution.

10. The method of claim 9, wherein bitline forcing voltages applied to bitlines connected to the multi-level cells of the second through seventh intermediate states have levels which are inversely proportional to levels of the threshold voltage distributions of the second through seventh intermediate states and are between the power supply voltage level and a ground voltage level.

11. The method of claim 8, wherein while the pre-programming pulse is applied to one of the groups, an inhibit voltage having a power supply voltage level is applied to bitlines connected to multi-level cells of other groups.

12. The method of claim 1, wherein the main programming operation is performed by applying an incremental step pulse to the multi-level cells.

13. The method of claim 1, wherein performing the pre-programming operation comprises:
    selecting at least two of the intermediate states; and
    applying bitline forcing voltages to bitlines connected to multi-level cells having the selected intermediate states while applying the pre-programming pulse to the multi-level cells having the selected intermediate states.

14. The method of claim 13, wherein the bitline forcing voltages have levels according to the selected intermediate states, and the pre-programming pulse is applied to the multi-level cells having the selected intermediate states at least one time.

15. A method of programming a nonvolatile memory device including multi-level cells that store multi-bit data, the method comprising:
    performing a first pre-programming operation that programs at least some of the multi-level cells to a plurality of intermediate states which are different from an erased state, at least some of the intermediate program states having threshold voltage distributions that partially overlap each other;
    applying a plurality of pre-programming verify voltages to the multi-level cells to verify the intermediate states;
    performing selectively a second pre-programming on the multi-level cells based on the verified intermediate states; and
    performing a main programming operation that programs the multi-level cells to a plurality of target states corresponding to the multi-bit data.

16. A nonvolatile memory device, comprising:
    a memory cell array comprising a plurality of word lines, a plurality of bitlines, and a plurality of nonvolatile multi-level cells (MLCs) each connected to respective ones of the wordlines and the bitlines, wherein each MLC is configured to store at least two bits of data therein;
    a row decoder configured to supply row addresses to be applied to wordlines of the memory cell array during operations of writing the data into the MLCs and reading the data stored in the MLCs;
    a voltage generator configured to generate one or more bitline voltages for being supplied to one or more of the bitlines and one or more wordline voltages for being applied to one or more of the wordlines;
    a control circuit configured to control an operation of the row decoder; and
    an input/output (I/O) circuit configured to write the data into the MLCs and read the data from the MLCs under control of the control circuit, wherein the I/O circuit is configured to write the data into the MLCs by:
        performing a pre-programming operation that programs at least some of the MLCs to a plurality of intermediate states which are different from an erased state of the MLCs, at least some of the intermediate states having threshold voltage distributions that partially overlap each other, and
        performing a main programming operation that programs the multi-level cells to a plurality of target states corresponding to the multi-bit data.

17. The nonvolatile memory device of claim 16, wherein the I/O circuit is configured to apply bitline forcing voltages with different levels to bitlines connected to the MLCs while applying a pre-programming pulse to the MLCs during the pre-programming operation.

18. The nonvolatile memory device of claim 17, wherein the intermediate states include at least first, second, and third intermediate states, and wherein a threshold voltage distribution of the first intermediate state is substantially the same as a threshold voltage distribution of the erased state, a threshold voltage distribution of the second intermediate state is greater than a threshold voltage distribution of the erased state, and a threshold voltage distribution of the third intermediate state is greater than the threshold voltage distribution of the second intermediate state.

19. The nonvolatile memory device of claim 18, wherein the I/O circuit is configured to apply an inhibit voltage having a power supply voltage level to an MLC having the erased state, to apply a first bitline forcing voltage to a MLC having the first intermediate state, to apply a second bitline forcing voltage to a MLC having the second intermediate state, and to apply a third bitline forcing voltage to a MLC having the third intermediate state, the first bit line forcing voltage having the power supply voltage level and the second and third bitline forcing voltages being between the power supply voltage level and a ground voltage level.

20. The nonvolatile memory device of claim 19, wherein the second bitline forcing voltage is greater than the third bitline forcing voltage.

* * * * *